(12) United States Patent
Tsai et al.

(10) Patent No.: US 12,347,729 B2
(45) Date of Patent: Jul. 1, 2025

(54) METAL GATES OF TRANSISTORS HAVING REDUCED RESISTIVITY

(71) Applicant: Taiwan Semiconductor Manufacturing Co., Ltd., Hsinchu (TW)

(72) Inventors: Chia-Ching Tsai, Tainan (TW); Yi-Wei Chiu, Kaohsiung (TW); Li-Te Hsu, Shanhua Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/475,753

(22) Filed: Sep. 27, 2023

(65) Prior Publication Data

US 2024/0021473 A1  Jan. 18, 2024

Related U.S. Application Data

(63) Continuation of application No. 17/325,608, filed on May 20, 2021, now Pat. No. 11,810,819, which is a
(Continued)

(51) Int. Cl.
*H01L 21/28* (2025.01)
*H01L 21/768* (2006.01)
(Continued)

(52) U.S. Cl.
CPC .. *H01L 21/76889* (2013.01); *H01L 21/28088* (2013.01); *H01L 21/76805* (2013.01);
(Continued)

(58) Field of Classification Search
None
See application file for complete search history.

(56) References Cited

U.S. PATENT DOCUMENTS 5,387,550 A   2/1995  Cheffings et al.
5,672,914 A   9/1997  Huang et al.
(Continued)

FOREIGN PATENT DOCUMENTS

CN   1790663 A   6/2006
CN   103579175 A   2/2014
(Continued)

*Primary Examiner* — Kyoung Lee
(74) *Attorney, Agent, or Firm* — Slater Matsil, LLP

(57) ABSTRACT

A method includes forming a transistor, which includes forming a gate dielectric on a semiconductor region, forming a gate electrode over the gate dielectric, and forming a source/drain region extending into the semiconductor region. The method further includes forming a source/drain contact plug over and electrically coupling to the source/drain region, and forming a gate contact plug over and in contact with the gate electrode. At least one of the forming the gate electrode, the forming the source/drain contact plug, and the forming the gate contact plug includes forming a metal nitride barrier layer, and depositing a metal-containing layer over and in contact with the metal nitride barrier layer. The metal-containing layer includes at least one of a cobalt layer and a metal silicide layer.

20 Claims, 21 Drawing Sheets

Related U.S. Application Data continuation of application No. 17/087,058, filed on Nov. 2, 2020, now Pat. No. 11,430,694, which is a continuation of application No. 16/715,651, filed on Dec. 16, 2019, now Pat. No. 10,825,727, which is a continuation of application No. 16/191,908, filed on Nov. 15, 2018, now Pat. No. 10,510,596, which is a continuation of application No. 15/613,485, filed on Jun. 5, 2017, now Pat. No. 10,141,225.

(60) Provisional application No. 62/491,823, filed on Apr. 28, 2017.

(51) Int. Cl.
*H01L 23/532* (2006.01)
*H01L 23/535* (2006.01)
*H10D 30/01* (2025.01)
*H10D 30/62* (2025.01)
*H10D 62/00* (2025.01)
*H10D 62/13* (2025.01)
*H10D 64/01* (2025.01)
*H10D 64/66* (2025.01)
*H10D 64/68* (2025.01)

(52) U.S. Cl.
CPC .... *H01L 21/7684* (2013.01); *H01L 21/76843* (2013.01); *H01L 21/76895* (2013.01); *H01L 23/53209* (2013.01); *H01L 23/535* (2013.01); *H10D 30/0212* (2025.01); *H10D 30/024* (2025.01); *H10D 30/62* (2025.01); *H10D 30/6211* (2025.01); *H10D 30/6219* (2025.01); *H10D 62/021* (2025.01); *H10D 62/151* (2025.01); *H10D 64/017* (2025.01); *H10D 64/018* (2025.01); *H10D 64/021* (2025.01); *H10D 64/667* (2025.01); *H10D 64/685* (2025.01); *H10D 64/691* (2025.01)

(56) References Cited

U.S. PATENT DOCUMENTS

| | | |
|---|---|---|
| 5,714,804 A | 2/1998 | Miller et al. |
| 5,998,873 A * | 12/1999 | Blair .............. H01L 23/485 257/766 |
| 7,189,650 B2 | 3/2007 | Liu et al. |
| 8,492,228 B1 | 7/2013 | Leobandung et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,836,129 B1 | 9/2014 | Hung et al. |
| 8,860,148 B2 | 10/2014 | Hu et al. |
| 9,105,490 B2 | 8/2015 | Wang et al. |
| 9,147,767 B2 | 9/2015 | Chen et al. |
| 9,153,483 B2 | 10/2015 | Shieh et al. |
| 9,209,273 B1 | 12/2015 | Lin et al. |
| 9,236,267 B2 | 1/2016 | De et al. |
| 9,236,300 B2 | 1/2016 | Liaw |
| 9,466,565 B2 | 10/2016 | Bohr et al. |
| 9,466,727 B1 * | 10/2016 | Hsu .................. H01L 29/66969 |
| 9,496,362 B1 | 11/2016 | Alptekin et al. |
| 9,502,265 B1 | 11/2016 | Jiang et al. |
| 9,520,482 B1 | 12/2016 | Chang et al. |
| 9,576,814 B2 | 2/2017 | Wu et al. |
| 9,614,052 B2 | 4/2017 | Su et al. |
| 9,741,812 B1 | 8/2017 | Adusumilli et al. |
| 10,079,210 B2 | 9/2018 | Lee et al. |
| 10,141,225 B2 | 11/2018 | Tsai et al. |
| 10,483,165 B2 | 11/2019 | Wang et al. |
| 10,510,596 B2 | 12/2019 | Tsai et al. |
| 10,985,061 B2 | 4/2021 | Wang et al. |
| 2006/0046318 A1 | 3/2006 | Ueda et al. |
| 2006/0113006 A1 | 6/2006 | Masuda et al. |
| 2008/0265417 A1 | 10/2008 | Kawamura et al. |
| 2010/0155846 A1 | 6/2010 | Mukherjee et al. |
| 2011/0062502 A1 | 3/2011 | Yin et al. |
| 2012/0043592 A1 | 2/2012 | Zhao et al. |
| 2012/0061698 A1 | 3/2012 | Toscano et al. |
| 2013/0168255 A1 | 7/2013 | Frederich et al. |
| 2014/0004693 A1 | 1/2014 | Hoon |
| 2014/0027822 A1 | 1/2014 | Su et al. |
| 2014/0117550 A1 | 5/2014 | Motoyama et al. |
| 2014/0120711 A1 | 5/2014 | Tsai et al. |
| 2014/0199837 A1 | 7/2014 | Hung et al. |
| 2014/0220777 A1 | 8/2014 | Yang et al. |
| 2015/0069620 A1 | 3/2015 | Chi et al. |
| 2015/0072511 A1 | 3/2015 | Liu et al. |
| 2015/0279734 A1 | 10/2015 | Chowdhury et al. |
| 2015/0364371 A1 | 12/2015 | Yen et al. |
| 2016/0020301 A1 | 1/2016 | Park et al. |
| 2016/0099216 A1 | 4/2016 | Lin et al. |
| 2016/0379925 A1 | 12/2016 | Ok et al. |
| 2017/0005005 A1 | 1/2017 | Chen et al. |
| 2017/0084721 A1 | 3/2017 | Hung et al. |
| 2017/0103948 A1 | 4/2017 | Lee et al. |
| 2018/0096934 A1 * | 4/2018 | Siew ................ H01L 29/41791 |
| 2018/0190785 A1 | 7/2018 | Hung et al. |

FOREIGN PATENT DOCUMENTS

| | | |
|---|---|---|
| CN | 105280591 A | 1/2016 |
| JP | 2006066514 A | 3/2006 |
| KR | 0172524 B1 | 3/1999 |
| KR | 100727449 B1 | 6/2007 |
| KR | 20150030135 A | 3/2015 |
| KR | 20150093583 A | 8/2015 |
| KR | 20170004827 A | 1/2017 |
| KR | 20170042938 A | 4/2017 |
| WO | 2014105477 A1 | 7/2014 |

* cited by examiner

METAL GATES OF TRANSISTORS HAVING REDUCED RESISTIVITY

PRIORITY CLAIM AND CROSS-REFERENCE

This application is a continuation of U.S. patent application Ser. No. 17/325,608, entitled "Metal Gates of Transistors Having Reduced Resistivity," and filed May 20, 2021, which is a continuation of U.S. patent application Ser. No. 17/087,058, entitled "Metal Gates of Transistors Having Reduced Resistivity," and filed Nov. 2, 2020, now U.S. Pat. No. 11,430,694 issued Aug. 30, 2022, which is a continuation of U.S. patent application Ser. No. 16/715,651, entitled "Metal Gates of Transistors Having Reduced Resistivity," and filed Dec. 16, 2019, now U.S. Pat. No. 10,825,727 issued Nov. 3, 2020, which is a continuation of U.S. patent application Ser. No. 16/191,908, entitled "Metal Gates of Transistors Having Reduced Resistivity," and filed Nov. 15, 2018, now U.S. Pat. No. 10,510,596 issued Dec. 17, 2019, which is a continuation of U.S. patent application Ser. No. 15/613,485, entitled "Metal Gates of Transistors Having Reduced Resistivity," and filed Jun. 5, 2017, now U.S. Pat. No. 10,141,225 issued Nov. 27, 2018, which claims the benefit of U.S. Provisional Application No. 62/491,823, filed Apr. 28, 2017, and entitled "Metal Gates of Transistors Having Reduced Resistivity," which applications are hereby incorporated herein by reference.

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves depositing metal layers and then performing Chemical Mechanical Polish (CMP) to remove excess portions of the metal layers. The remaining portions of the metal layers form metal gates. The metal gates are then recessed. The metal gates may include tungsten. However, tungsten does not have good adhesion to underlying layers. Accordingly, a tungsten nucleation layer is formed, followed by the deposition of an additional tungsten layer. The tungsten nucleation layer has improved adhesion to its underlying layer. The resistivity of the tungsten nucleation layer, however, is much higher than the overlying deposited tungsten. Accordingly, when the MOS devices are scaled down, and the widths of the metal gates are very small, the resistivity of the tungsten nucleation layer significantly impacts the performance of the resulting transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
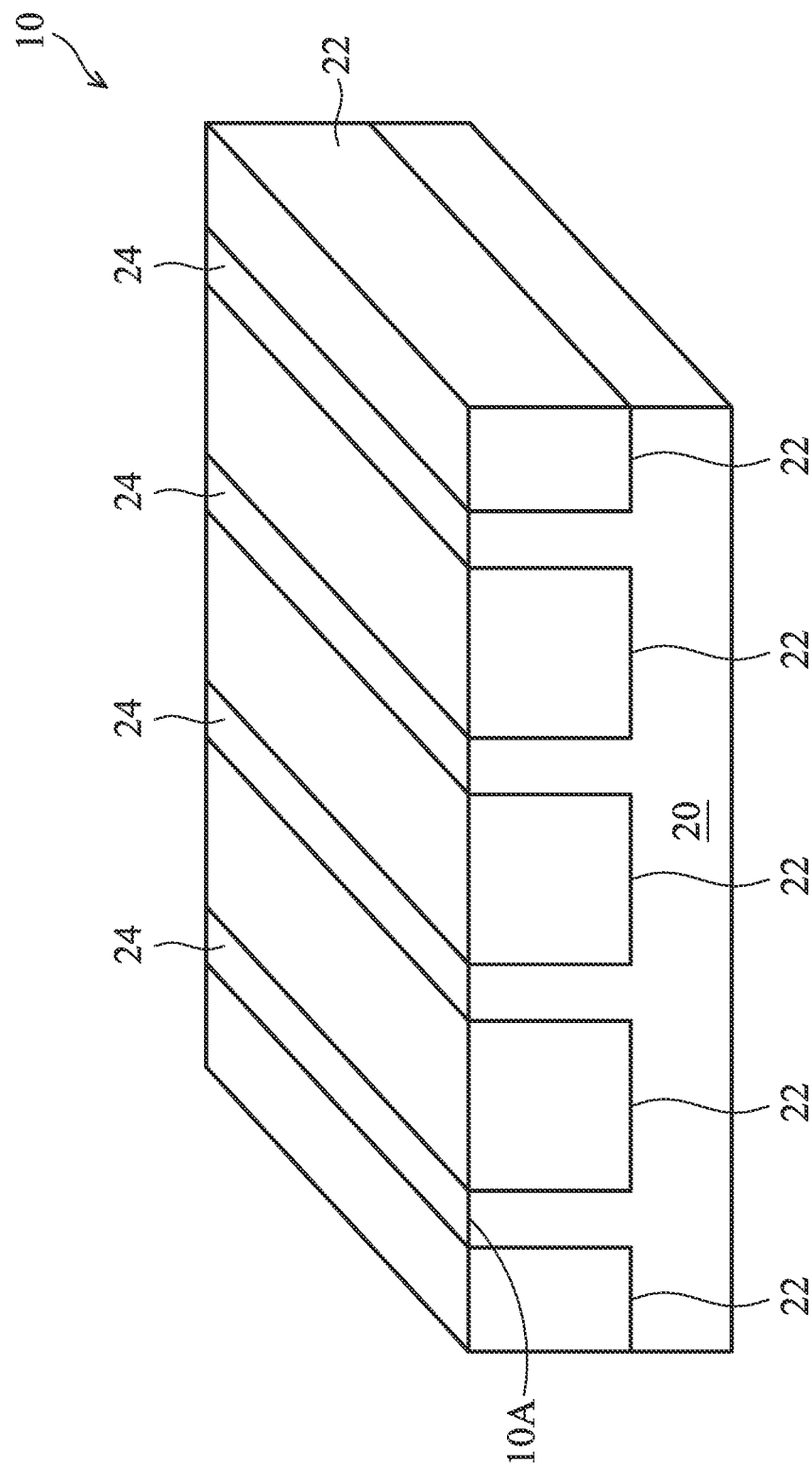
FIGS. 1 through 18 illustrate the cross-sectional views and perspective views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistor (FinFETs) is used as an example to explain the concepts of the present disclosure. Planar transistors may also adopt the concept of the present disclosure.

Figure 20:
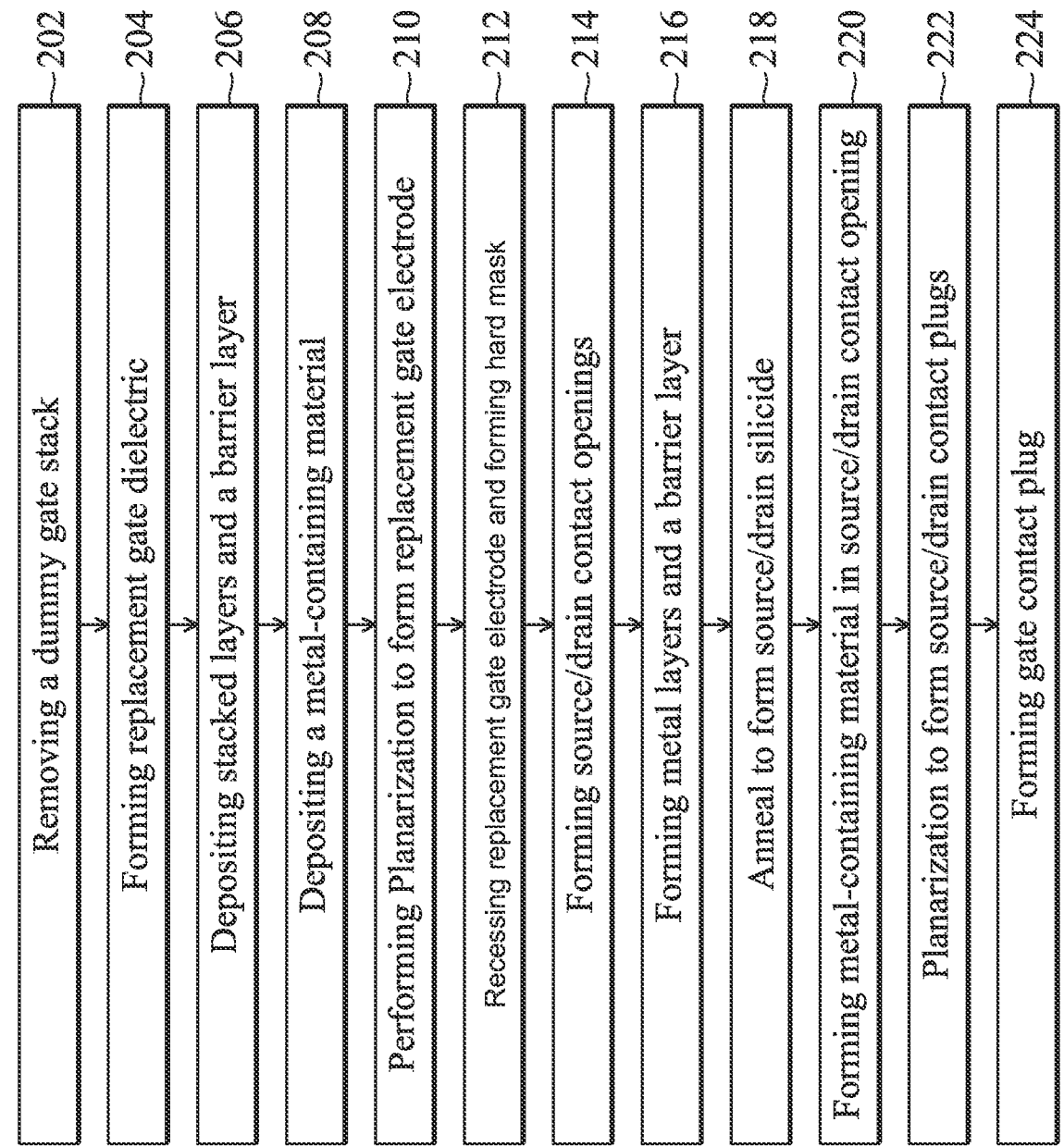
FIG. 20 illustrates a flow chart of a process for forming a FinFET in accordance with some embodiments.

FIGS. 1 through 18 illustrate the cross-sectional views and perspective views of intermediate stages in the formation of FinFETs in accordance with some embodiments of the present disclosure. The steps shown in FIGS. 1 through 18 are also reflected schematically in the process flow shown in FIG. 20.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20, wherein the top surface of substrate 20 is a major surface 10A of wafer 10. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed of Flowable Chemical Vapor Deposition (FCVD), spin-on, or the like.

Figure 2:
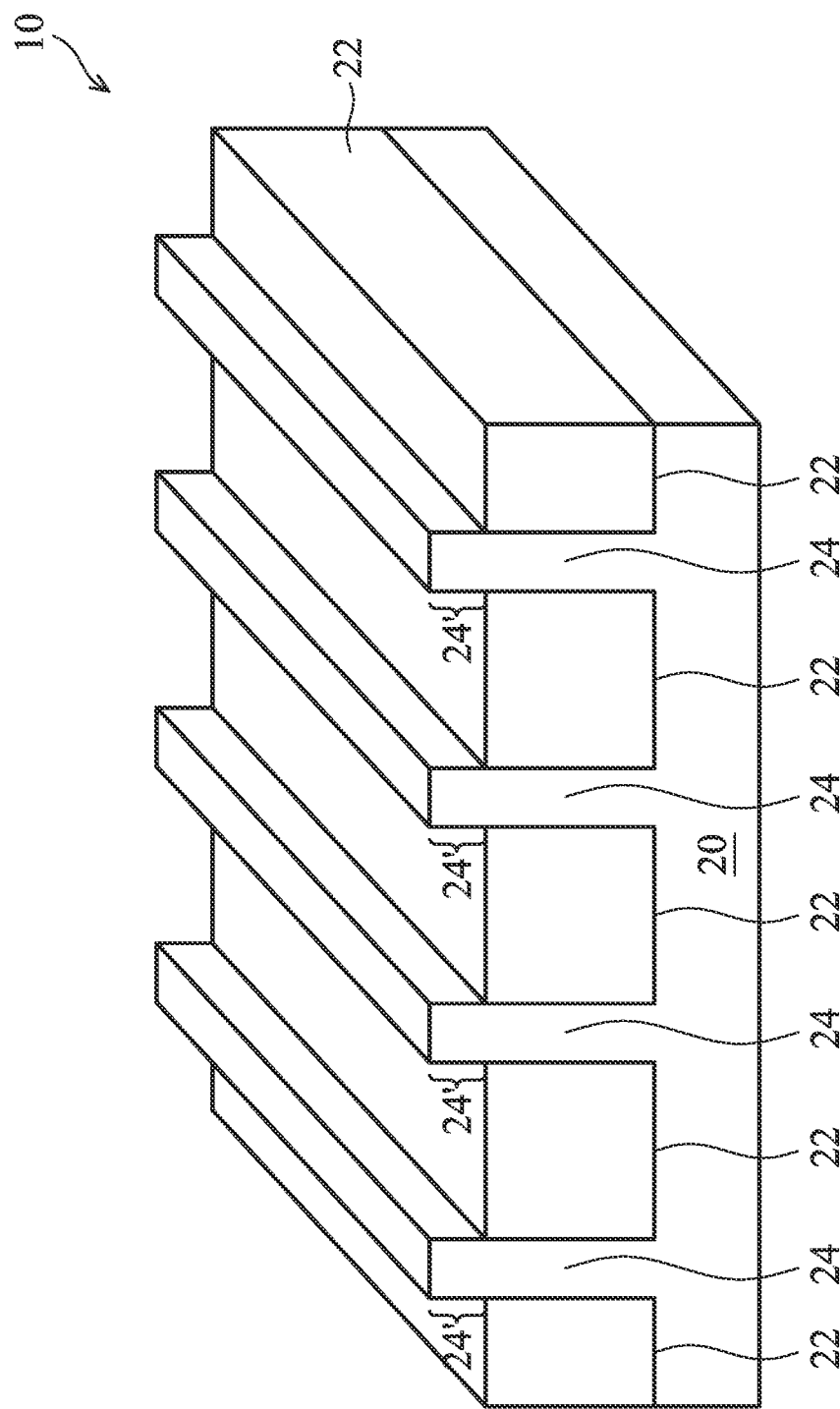

Referring to FIG. 2, STI regions 22 are recessed, so that the top portions of semiconductor strips 24 protrude higher than the top surfaces of STI regions 22 to form protruding fins 24'. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

Figure 3:
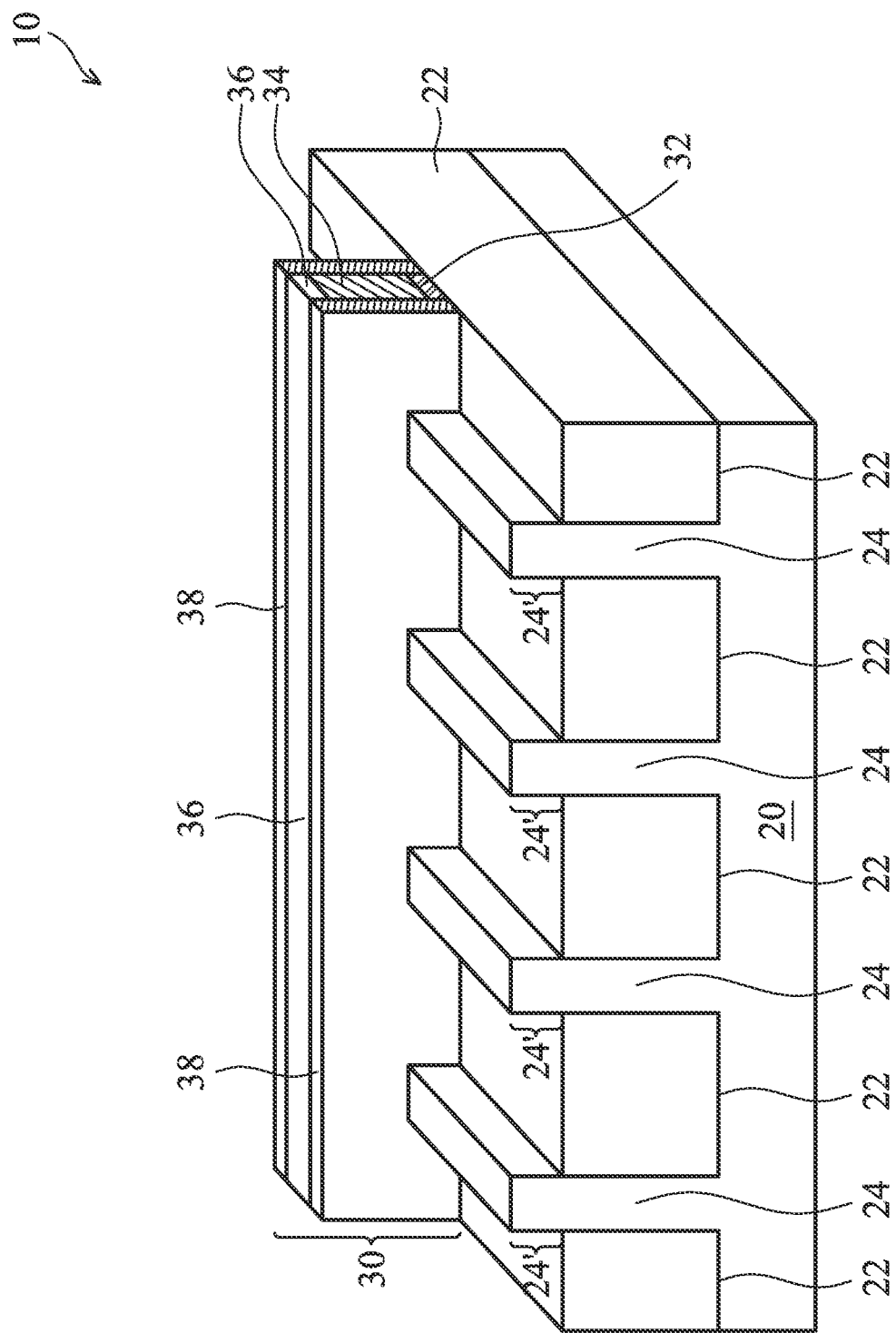

Referring to FIG. 3, dummy gate stack 30 is formed on the top surfaces and the sidewalls of protruding fins 24'. Dummy gate stack 30 may include dummy gate dielectric 32 and dummy gate electrode 34 over dummy gate dielectric 32. Dummy gate electrode 34 may be formed, for example, using polysilicon, and other materials may also be used. Dummy gate stack 30 may also include one (or a plurality of) hard mask layer 36 over dummy gate electrode 34. Hard mask layer 36 may be formed of silicon nitride, silicon carbo-nitride, or the like. Dummy gate stack 30 may cross over a single one or a plurality of protruding fins 24' and/or STI regions 22. Dummy gate stack 30 may also have a lengthwise direction perpendicular to the lengthwise direction of protruding fins 24'.

Next, gate spacers 38 are formed on the sidewalls of dummy gate stack 30. In accordance with some embodiments of the present disclosure, gate spacers 38 are formed of a dielectric material such as silicon carbon-oxyitride (SiCN), silicon nitride, or the like, and may have a single-layer structure or a multi-layer structure including a plurality of dielectric layers.

Figure 4:
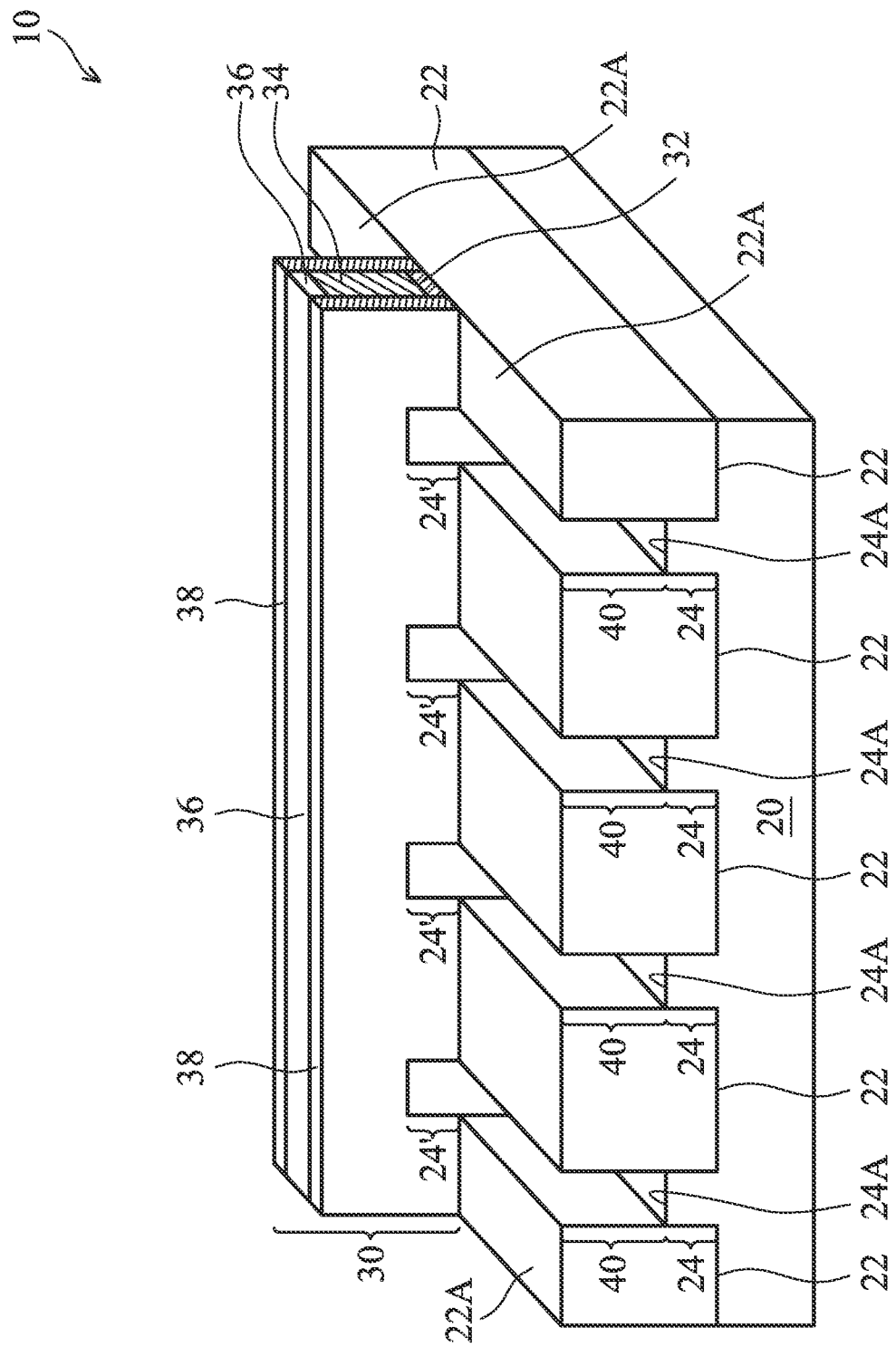

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stack 30 and gate spacers 38 are protected, and are not etched. The top surfaces 24A of the recessed semiconductor strips 24 may be lower than the top surfaces 22A of STI regions 22 in accordance with some embodiments. Recesses 40 are accordingly formed between STI regions 22. Recesses 40 are located on opposite sides of dummy gate stack 30.

Figure 5:
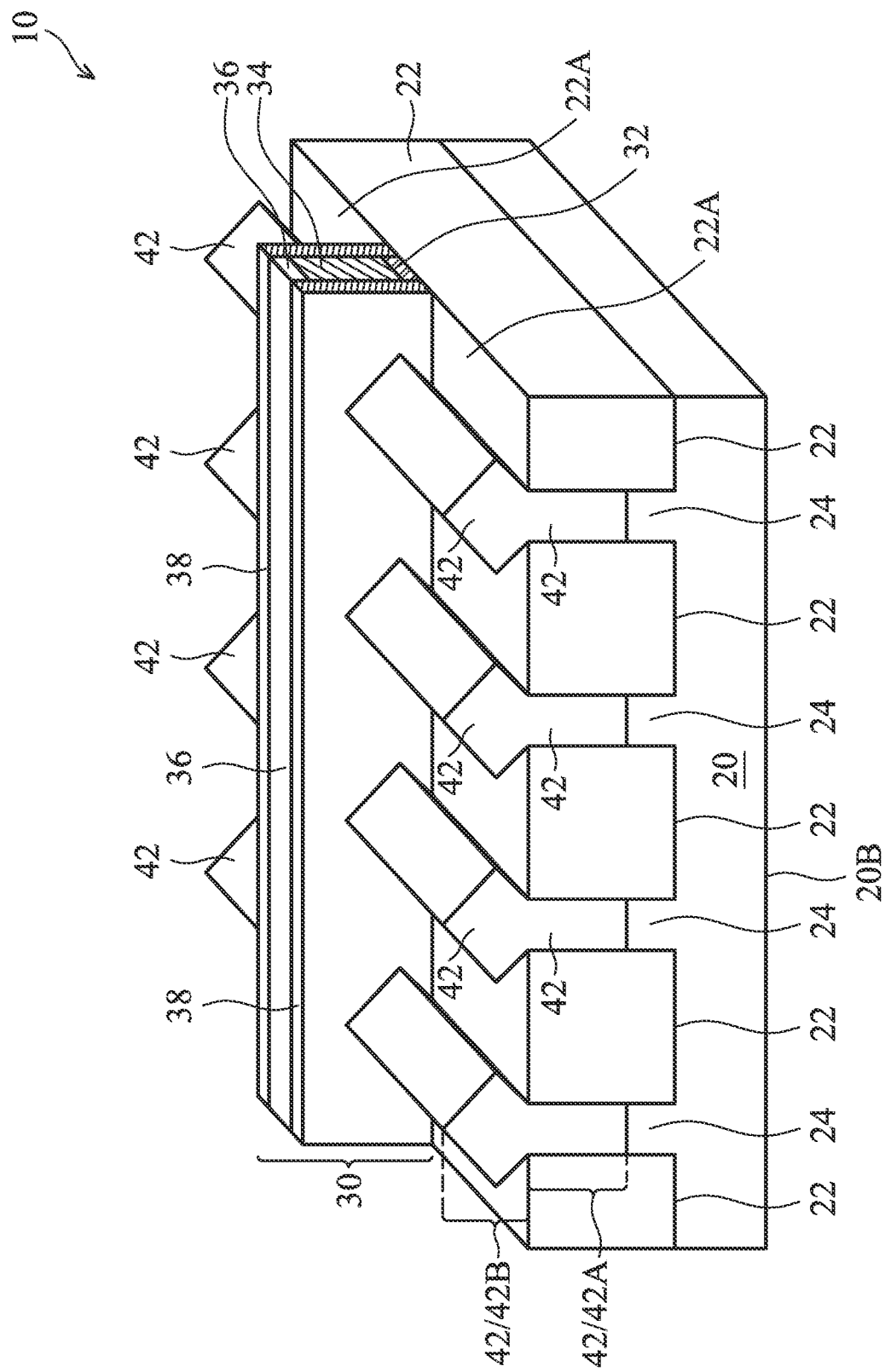

Next, epitaxy regions (source/drain regions) are formed by selectively growing a semiconductor material in recesses 40, resulting in the structure in FIG. 5. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 is formed of a III-V compound semiconductor such as GaAs, InP, GaN, InGaAs, InAlAs, GaSb, AlSb, AlAs, AlP, GaP, combinations thereof, or multi-layers thereof. After recesses 40 are filled with epitaxy regions 42, the further epitaxial growth of epitaxy regions 42 causes epitaxy regions 42 to expand horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy. Epitaxy regions 42 include lower portions 42A that are formed in STI regions 22, and upper portions 42B that are formed over the top surfaces 22A of STI regions 22. Lower portions 42A, whose sidewalls are shaped by the shapes of recesses 40 (FIG. 4), may have (substantially) straight edges, which may also be substantial vertical edges that are substantial perpendicular to the major surfaces (such as the bottom surface) of substrate 20.

Figure 6A:
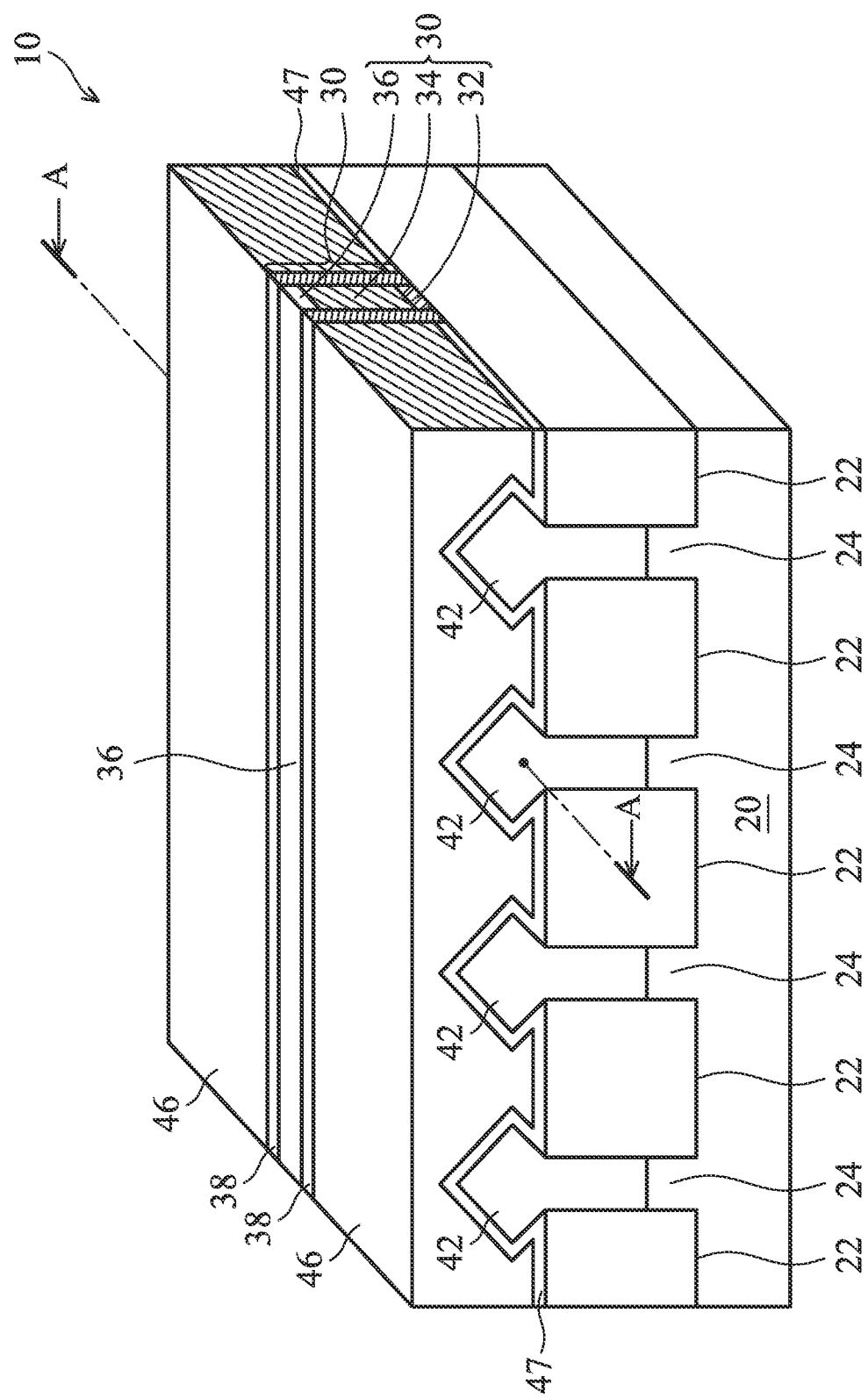

FIG. 6A illustrates a perspective view of the structure with Inter-Layer Dielectric (ILD) 46 being formed. In accordance with some embodiments of the present disclosure, a buffer oxide layer (not shown) and Contact Etch Stop Layer (CESL) 47 are formed on source and drain regions 42 before the formation of ILD 46. The buffer oxide layer may be formed of silicon oxide, and CESL 47 may be formed of silicon nitride, silicon carbo-nitride, or the like. The buffer oxide layer and CESL 47 may be formed using a conformal deposition method such as ALD, for example. ILD 46 may include a dielectric material formed using, for example, FCVD, spin-on coating, CVD, or other deposition methods. ILD 46 may also be formed of Phospho-Silicate Glass (PSG), Boro-Silicate Glass (BSG), Boron-Doped Phospho-Silicate Glass (BPSG), Tetra Ethyl Ortho Silicate (TEOS) oxide, or the like. A planarization such as Chemical Mechanical Polish (CMP) or mechanical grinding may be performed to level the top surfaces of ILD 46, dummy gate stack 30, and gate spacers 38 with each other.

Figure 6B:
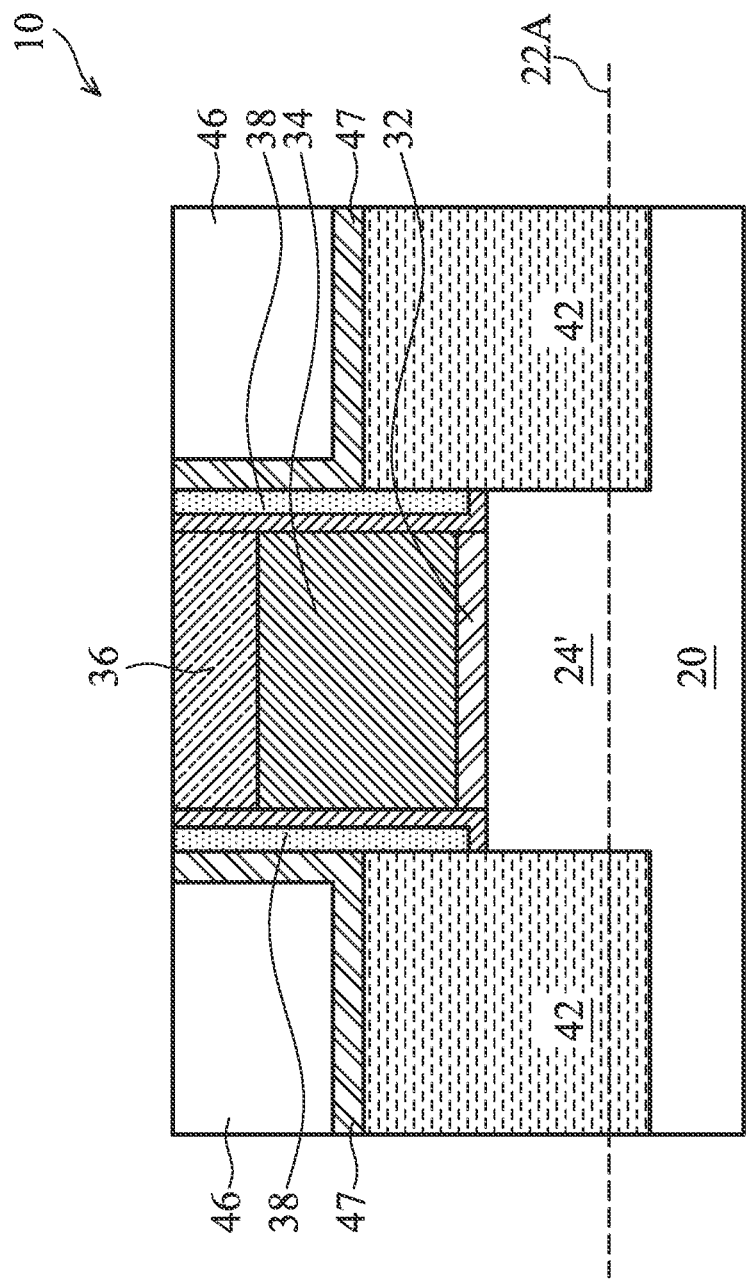

A cross-sectional view of the structure shown in FIG. 6A is illustrated in FIG. 6B, wherein the cross-sectional view is obtained from the vertical plane containing line A-A in FIG. 6A. Next, the dummy gate stack 30 including hard mask layer 36, dummy gate electrode 34 and dummy gate dielectric 32 are replaced with a metal gate and a replacement gate dielectric. The cross-sectional views shown in FIGS. 7 through 18 are obtained from the same vertical plane containing line A-A in FIG. 6A. In FIGS. 7 through 18, the level 22A of the top surfaces of STI regions 22 are illustrated, and semiconductor fins 24' are over level 22A.

Figure 7:
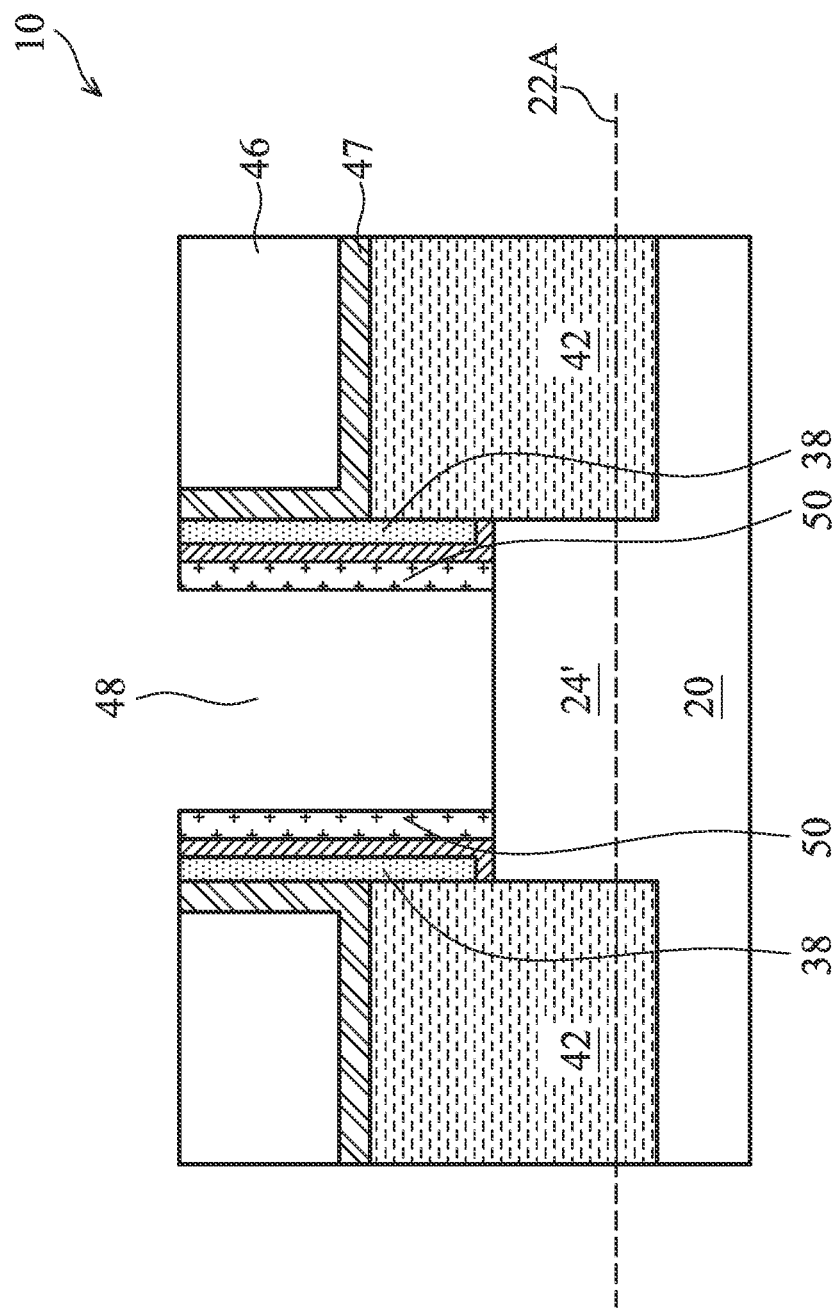

Hard mask layer 36, dummy gate electrode 34, and dummy gate dielectric 32 as shown in FIGS. 6A and 6B are removed, resulting in opening 48 as shown in FIG. 7 to be formed. The respective step is illustrated as step 202 in the process flow shown in FIG. 20. The top surfaces and the sidewalls of protruding fins 24' are exposed to opening 48.

FIG. 7 further illustrates the formation of gate spacers 50 in accordance with some embodiments. In accordance with alternative embodiments, gate spacers 50 are not formed. To form gate spacers 50, a blanket gate spacer layer may be formed, for example, using a deposition method such as ALD or CVD. The blanket gate spacer layer is conformal. In accordance with some embodiments of the present disclosure, the gate spacer layer is formed of silicon nitride (SiN), SiC, SiON, or another dielectric material, which may be the same or different from either one of the materials of gate spacers 38 and the materials of CESL 47 and ILD 46. Gate spacers 50 separate the subsequently formed metal gate farther away from source/drain regions 42, and the possibility of leakage and electrical shorting between them are reduced.

Figure 8:
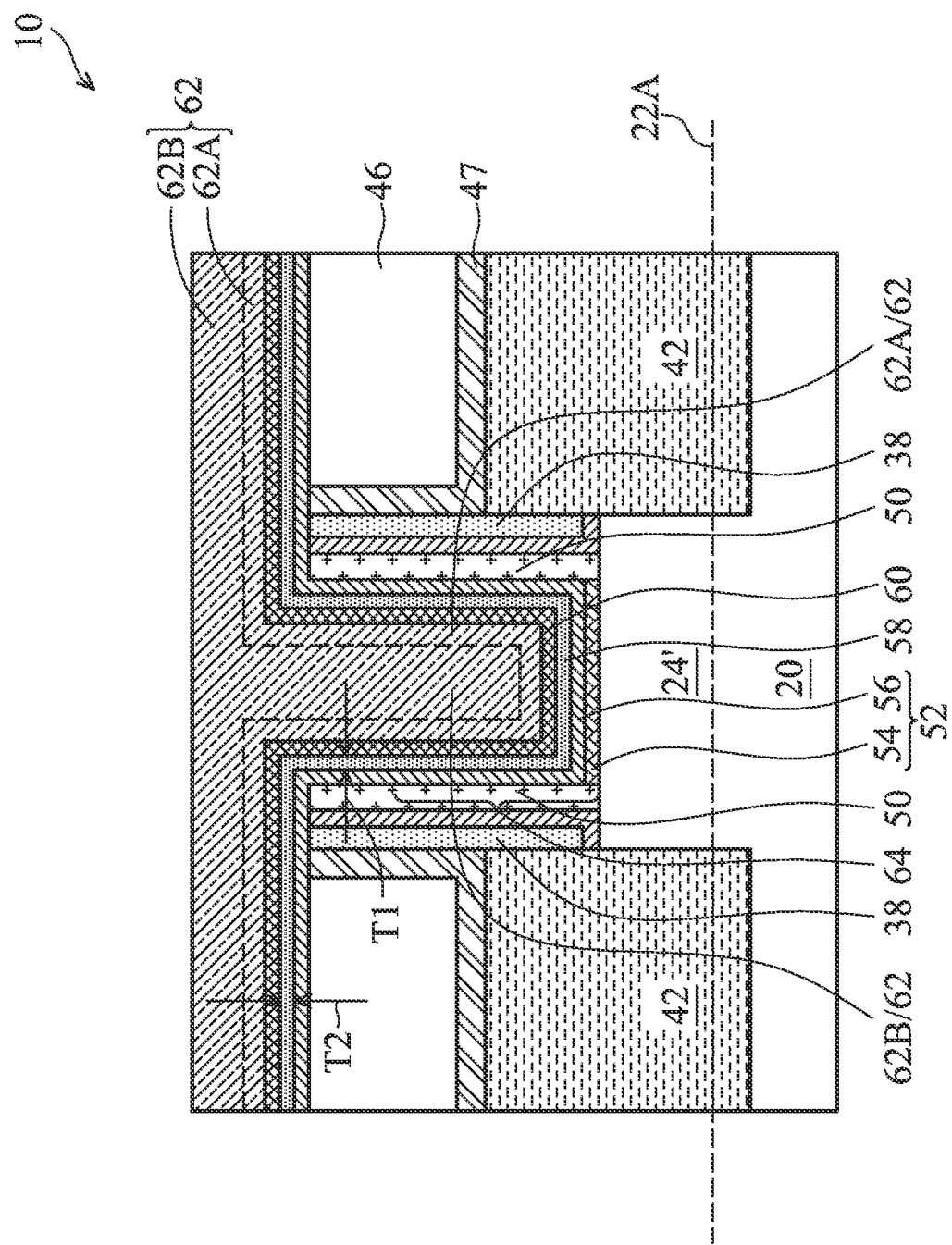

Next, referring to FIG. 8, gate dielectric 52 formed, which extends into opening 48. The respective step is illustrated as step 204 in the process flow shown in FIG. 20. In accordance with some embodiments of the present disclosure, gate dielectric 52 includes Interfacial Layer (IL) 54 as its lower part. IL 54 is formed on the exposed surfaces of protruding fins 24'. IL 54 may include an oxide layer such as a silicon oxide layer, which is formed through the thermal oxidation of protruding fins 24', a chemical oxidation process, or a deposition process. Gate dielectric 52 may also include high-k dielectric layer 56 formed over IL 54. High-k dielectric layer 56 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. High-k dielectric layer 56 is overlying, and may contact, IL 54. High-k dielectric layer 56 is formed as a conformal layer, and extends on the sidewalls of protruding fins 24' and the top surface and the sidewalls of gate spacers 38/50. In accordance with some embodiments of the present disclosure, high-k dielectric layer 56 is formed using ALD or CVD.

Referring further to FIG. 8, stacked layers 58 is deposited. The respective step is illustrated as step 206 in the process flow shown in FIG. 20. The sub-layers in stacked layers 58 are not shown separately, while in reality, the sub-layers are distinguishable since the sub-layers are formed of different materials and/or have different percentages of elements. The deposition may be performed using a conformal deposition method such as ALD or CVD, so that the thickness T1 of the vertical portions and thickness T2 of the horizontal portions of stacked layers 58 (and each of sub-layers) have thicknesses substantially equal to each other. Stacked layers 58 extend into opening 48, and include some portions over ILD 46.

Stacked layers 58 may include a diffusion barrier layer and one or more work function layer over the diffusion barrier layer. The diffusion barrier layer may be formed of titanium nitride, which may (or may not) be doped with silicon. Titanium nitride, when doped with silicon, is also sometimes referred to as titanium silicon nitride (Ti—Si—N, or TSN). Titanium nitride or titanium silicon nitride is a conductive material. The work function layer determines the work function of the gate electrode, and includes at least one layer, or a plurality of layers formed of different materials. The specific material of the work function layer may be selected according to whether the respective FinFET is an n-type FinFET or a p-type FinFET. For example, when the FinFET is an n-type FinFET, the work function layer may include a TaN layer and a titanium aluminum (TiAl) layer over the TaN layer. When the FinFET is a p-type FinFET, the work function layer may include a TaN layer, a TiN layer over the TaN layer, and a TiAl layer over the TiN layer. After the deposition of stacked layers 58, barrier layer 60, which may be another TiN layer, is formed. TiN layer 60 may be formed using CVD, and may act as a blocking layer. The respective step is also illustrated as step 206 in the process flow shown in FIG. 20. TiN layer 60 may be free from silicon in accordance with some embodiments.

Next, metal-containing material 62 is deposited, which has a bottom surface in physical contact with the top surface of TiN layer 60. The respective step is illustrated as step 208 in the process flow shown in FIG. 20. The formation of metal-containing material 62 may be achieved through CVD, ALD, or PVD. In accordance with some embodiments of the present disclosure, Physical Vapor Deposition (PVD) is used, which is performed using a cobalt target disposed over the respective wafer 10. In addition, precursors are also introduced during the PVD. Accordingly, the deposition includes both the PVD and the CVD. In accordance with some embodiments, the precursors for depositing metal-containing material 62 include a cobalt-containing precursor, a silicon-containing precursor, and possibly other gases. For example, the precursors for forming metal-containing material 62 may include tetraethoxysilane (TEOS), $SiHCl_3$, and a cobalt-containing precursor such as di-cobalt octacarbonyl, cobalt nitrosyl complexes, or β-diketonates of cobalt (II) and cobalt (III), and the like.

In accordance with some embodiments, metal-containing material 62 includes layer 62A and layer 62B over layer 62A. In accordance with some embodiments, layer 62A is a cobalt silicide ($Co_xSi_y$, with x and y being atomic percentages and having values between 0 and 1.0) layer. Layer 62B is a cobalt layer free from, or substantially free from (for example, with an atomic percentage lower than about 1 percent), silicon or other elements. With both layers 62A and 62B being cobalt-containing layers, the manufacturing cost may be reduced. For example, the same silicon-containing precursor and cobalt-containing precursor (and possibly an additional Co target) may be used for depositing both layer 62A and 62B. In accordance with an exemplary deposition process, when layer 62A ($Co_xSi_y$) is deposited, the temperature of wafer 10 may be in the range between about 85° C. and about 120° C. After the deposition of layer 62A is concluded, the temperature of wafer 10 is lowered, for example, to about 25° C., and with the same precursors (with or without using the additional Co target), cobalt layer 62B, which is free or substantially free from silicon, is formed. In accordance with some embodiments, the transition from the deposition of layer 62A to the deposition of layer 62B is achieved by lowering the temperature of wafer 10, while maintaining other process conditions (such as flow rates of the precursors, the partial pressures, the powers, etc.) unchanged. The formation of metal-containing material 62 may also be achieved by gradually reducing the temperature of wafer 10, so that layer 62A has a gradually reduced silicon content, with upper portions of layer 62A having less silicon than the respective lower portions. The gradual reduction of temperature may be continuous. The gradual reduction of temperature may also be through abrupt steps, which means the temperature abruptly drops to a lower step, and stay unchanged for a while before dropping to another lower stage. The gradual transition is continued until respective formed layer is free or substantially free from silicon, at which time layer 62 starts to form. The temperature may then be stable when the resulting layer is a cobalt layer. Accordingly, the entire layer 62B may be a cobalt layer free or substantially free from silicon and other elements, while layer 62A has gradually (abruptly or continuously) reduced silicon percentage.

In accordance with alternative embodiments, lower layer 62A is a cobalt layer, and upper layer 62B is a cobalt silicide layer. The formation process may be reversed than discussed above to form layers 62A and 62B.

In accordance with some embodiments, layer 62A is formed of a metal silicide (using a metal other than cobalt), which may be $Ti_xSi_y$, $Ni_xSi_y$, $W_xSi_y$, $Mo_xSi_y$, $Ta_xSi_y$, and layer 62B is a cobalt layer free or substantially free from silicon and other elements.

In accordance with some embodiments, the entire layer 62 is formed of a homogenous material, which may be cobalt (free or substantially free from silicon and other elements) or a metal silicide such as $Ti_xSi_y$, $Ni_xSi_y$, $W_xSi_y$, $Mo_xSi_y$, or $Ta_xSi_y$. The entire layer 62 has a uniform resistivity. When formed of the silicide layer, the entire layer 62 may have constant percentages x and y, and has the uniform resistivity, or may have gradually changed (such as gradually reduced or gradually increased) percentages x and y from bottom to top. The formation process may thus have constant process conditions (such as temperature, pressure, flow rate, or the like) throughout the formation of entire layer 62.

Figure 9:
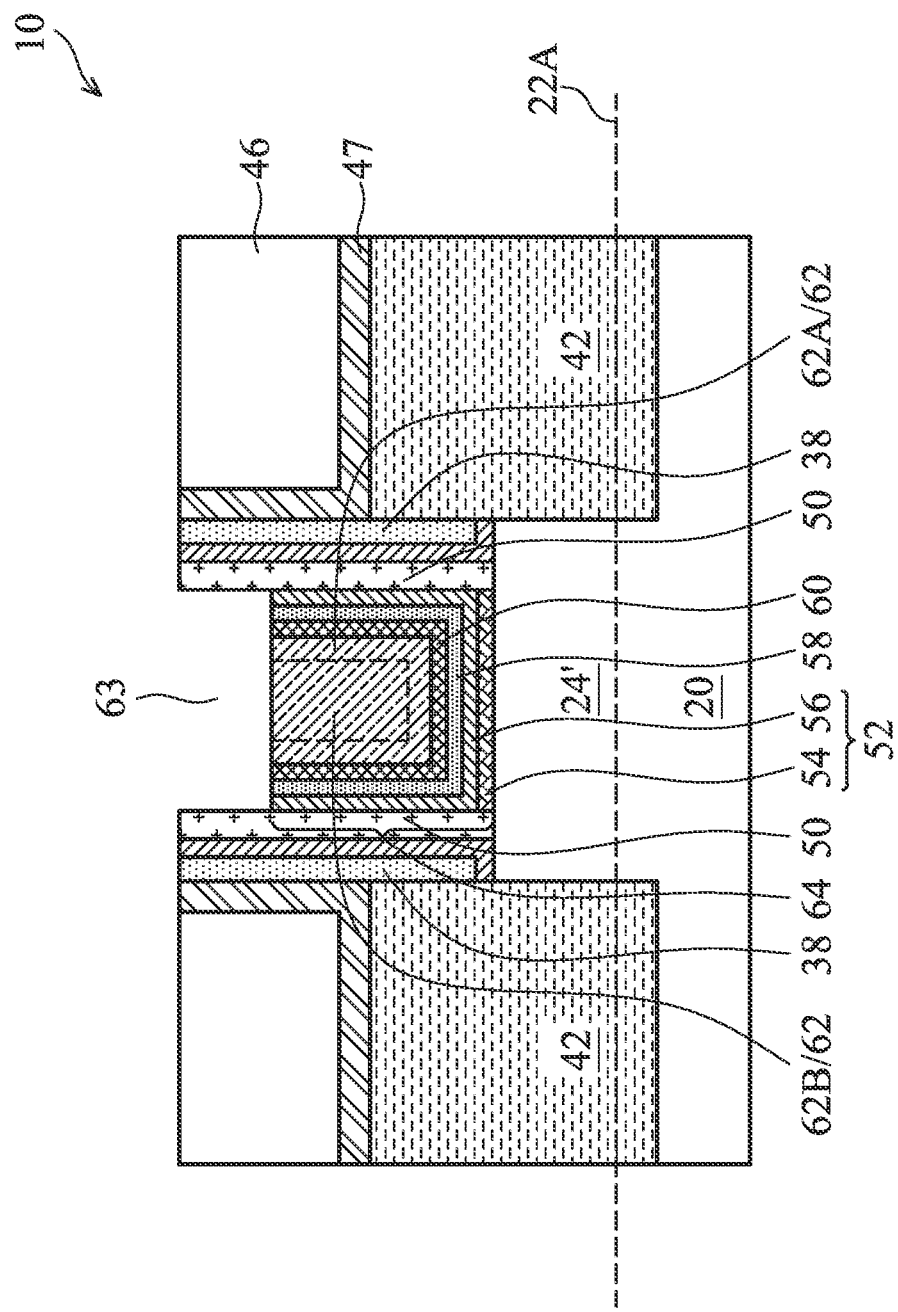

Next, a planarization such as a Chemical Mechanical Polish (CMP) or mechanical grinding is performed, so that the portions of layers 56, 58, 60, and 62 over ILD 46 are removed. The respective step is illustrated as step 210 in the process flow shown in FIG. 20. Next, as shown in FIG. 9, layers 56, 58, 60, and 62 are etched back, forming recess 63. The respective step is illustrated as step 212 in the process flow shown in FIG. 20. The remaining portion of layers 54, 56, 58, 60, and 62 are referred to as replacement gate stack 64 hereinafter.

Figure 10:
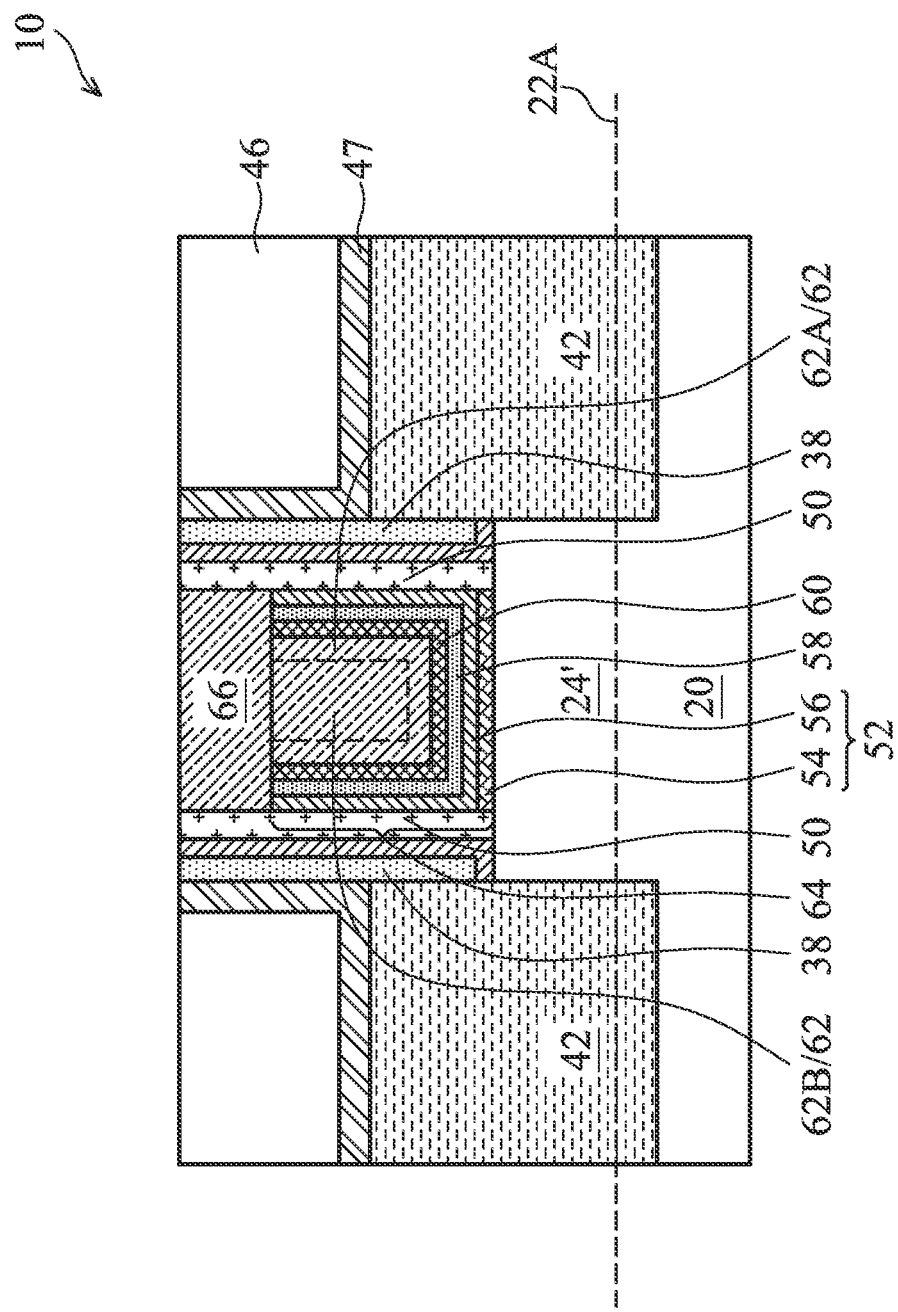

Hard mask 66 is formed over replacement gate stack 64, as shown in FIG. 10. The respective step is also illustrated as step 212 in the process flow shown in FIG. 20. In accordance with some embodiments of the present disclosure, the formation of hard mask 66 includes a deposition step to form a blanket dielectric material, and a planarization step to remove the excess dielectric material over gate spacers 38 and ILD 46. Hard mask 66 may be formed of silicon nitride, for example.

Figure 11:
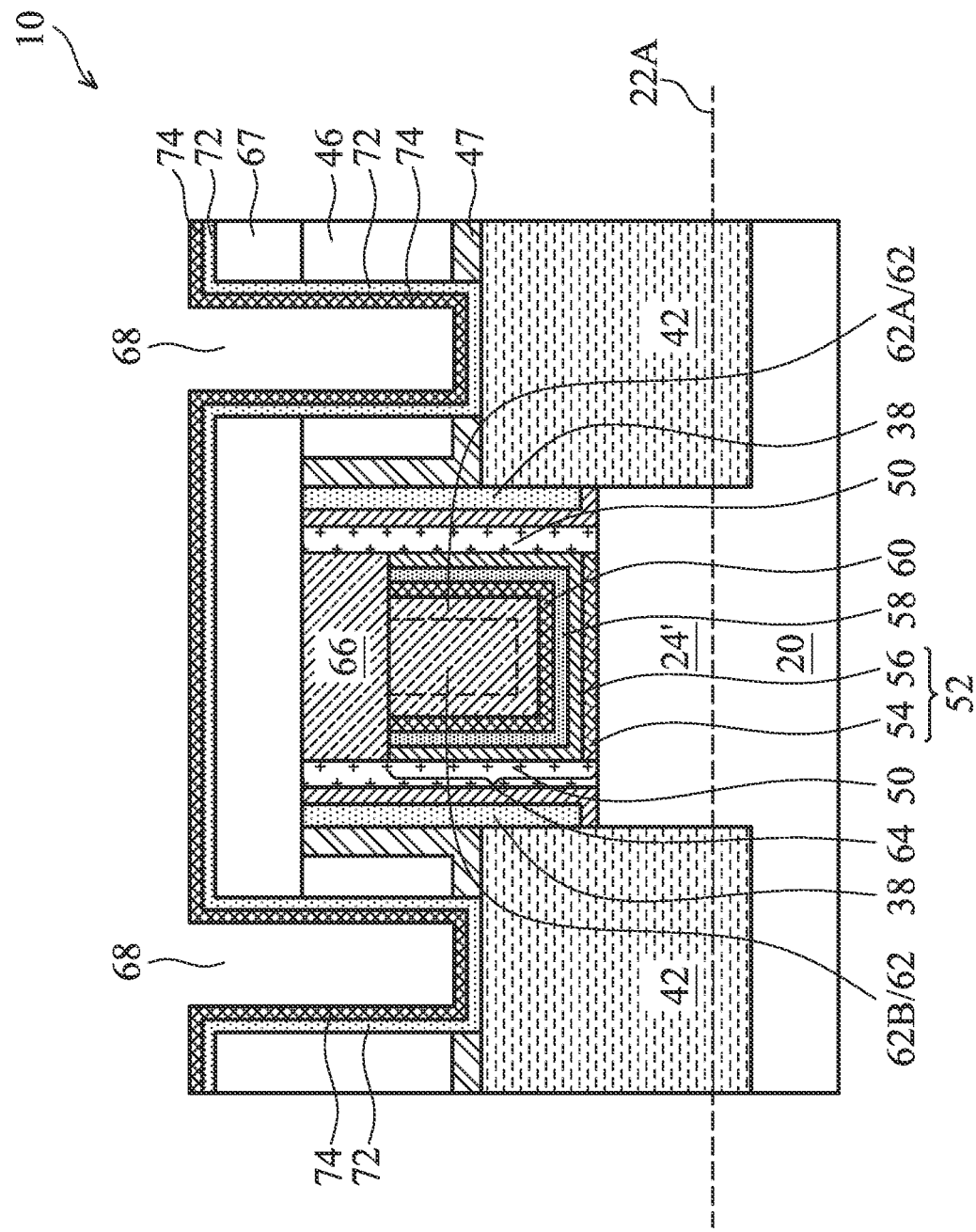

FIGS. 11 through 14 illustrate the formation of lower source/drain contact plugs. Referring to FIG. 11, dielectric layer 67 is formed over the structure shown in FIG. 10, followed by the application of a patterned photo resist (not shown). Next, dielectric layer 67, ILD 46, and CESL 47 are etched to form contact openings 68. The respective step is illustrated as step 214 in the process flow shown in FIG. 20.

Further referring to Figure ii, metal layer 72 (such as a titanium layer or a tantalum layer) is deposited, for example, using PVD. Barrier layer 74, which may be a metal nitride layer such as a titanium nitride layer or a tantalum nitride layer is then formed over metal layer 72. The respective step is illustrated as step 216 in the process flow shown in FIG. 20. Barrier layer 74 may be formed of using CVD. Layers 72 and 74 are both conformal, and extend into openings 68.

Figure 12:
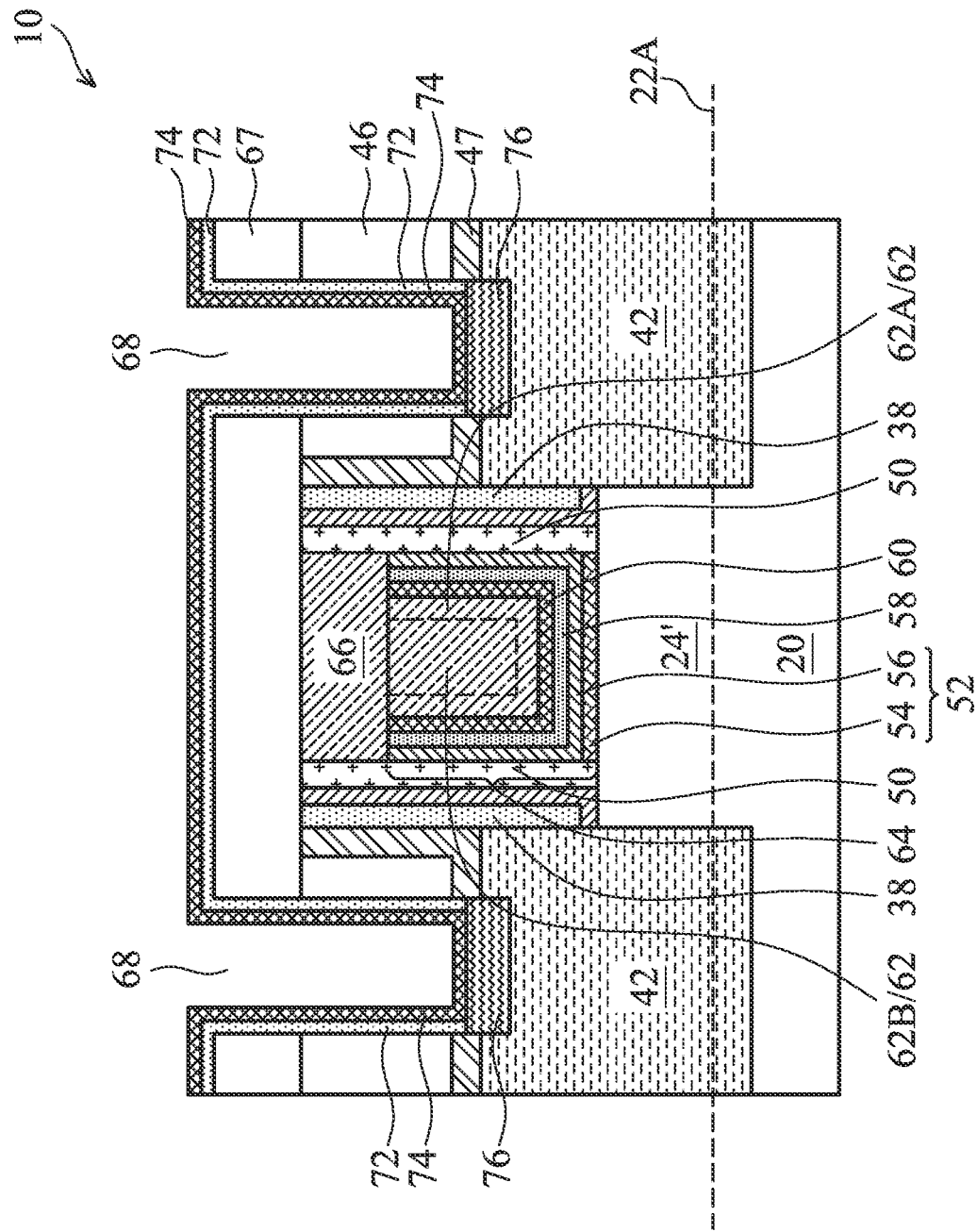

An anneal is then performed to form source/drain silicide regions 76, as shown in FIG. 12. The respective step is illustrated as step 218 in the process flow shown in FIG. 20. The anneal may be performed through Rapid Thermal Anneal (RTA), furnace anneal, or the like. Accordingly, the bottom portion of metal layer 72 reacts with source/drain region 42 to form silicide regions 76. The sidewall portions of metal layer 72 remain after the silicidation process. In accordance with some embodiments of the present disclosure, the top surface of silicide regions 76 are in contact with the bottom surface of barrier layer 74.

Figure 13:
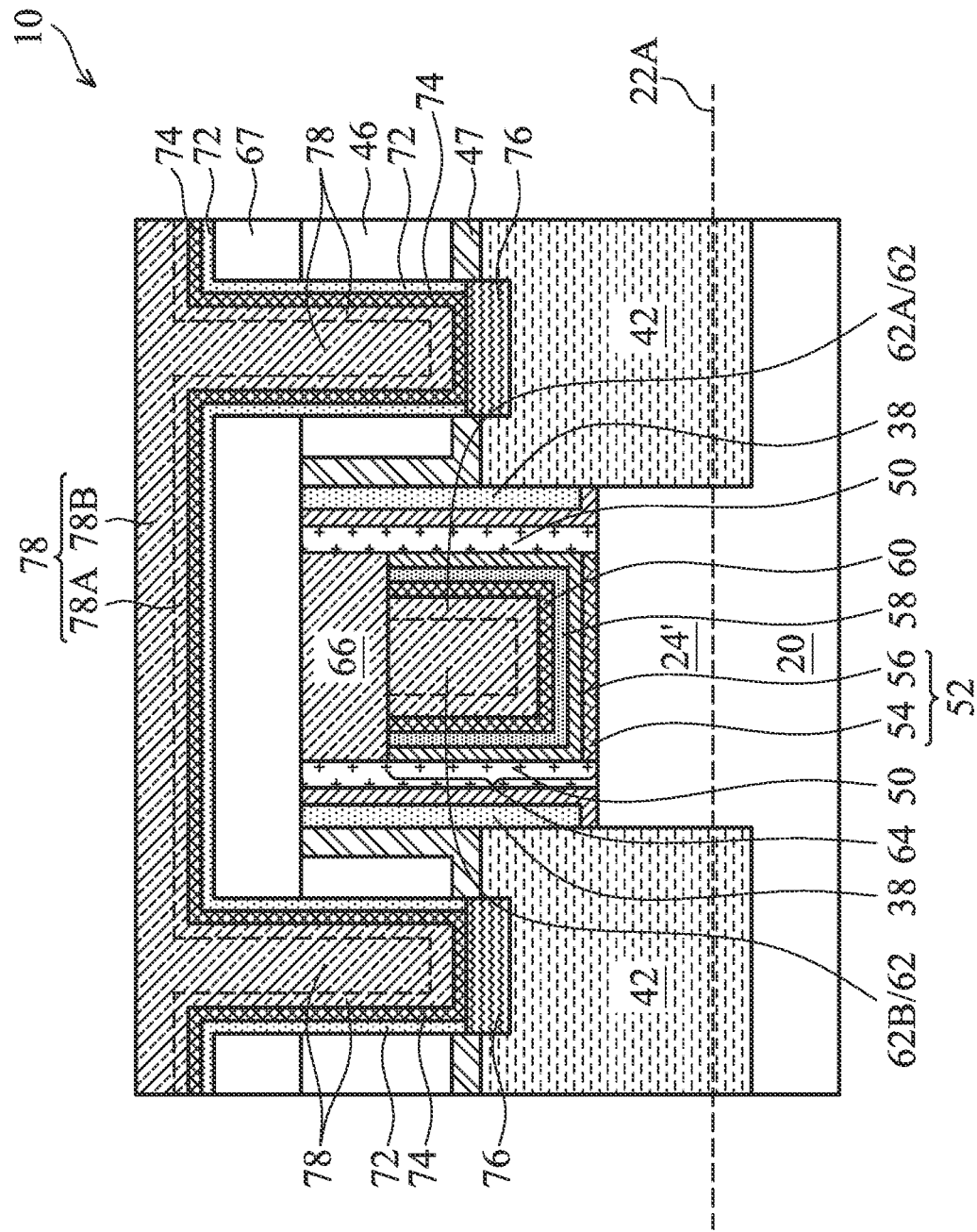

Next, as shown in FIG. 13, metal-containing layer 78 is deposited over and in contact with barrier layer 74. The respective step is illustrated as step 220 in the process flow shown in FIG. 20. Metal-containing layer 78 may be formed a material selected from the same group of candidate materials of metal-containing material 62. Furthermore, the formation method, the material, and the structure of metal-containing layer 78 may also be selected from the candidate formation methods, the candidate materials, and the candidate structures of metal-containing material 62. For example, metal-containing layer 78 may be a homogenous cobalt layer or a homogenous metal silicide layer, or may include a lower layer 78A and upper layer 78B, wherein the formation methods, the materials, and materials of layers 78A and 78B may be found referring to the above-discussed layers 62A and 62B, respectively, in any combination.

Figure 14:
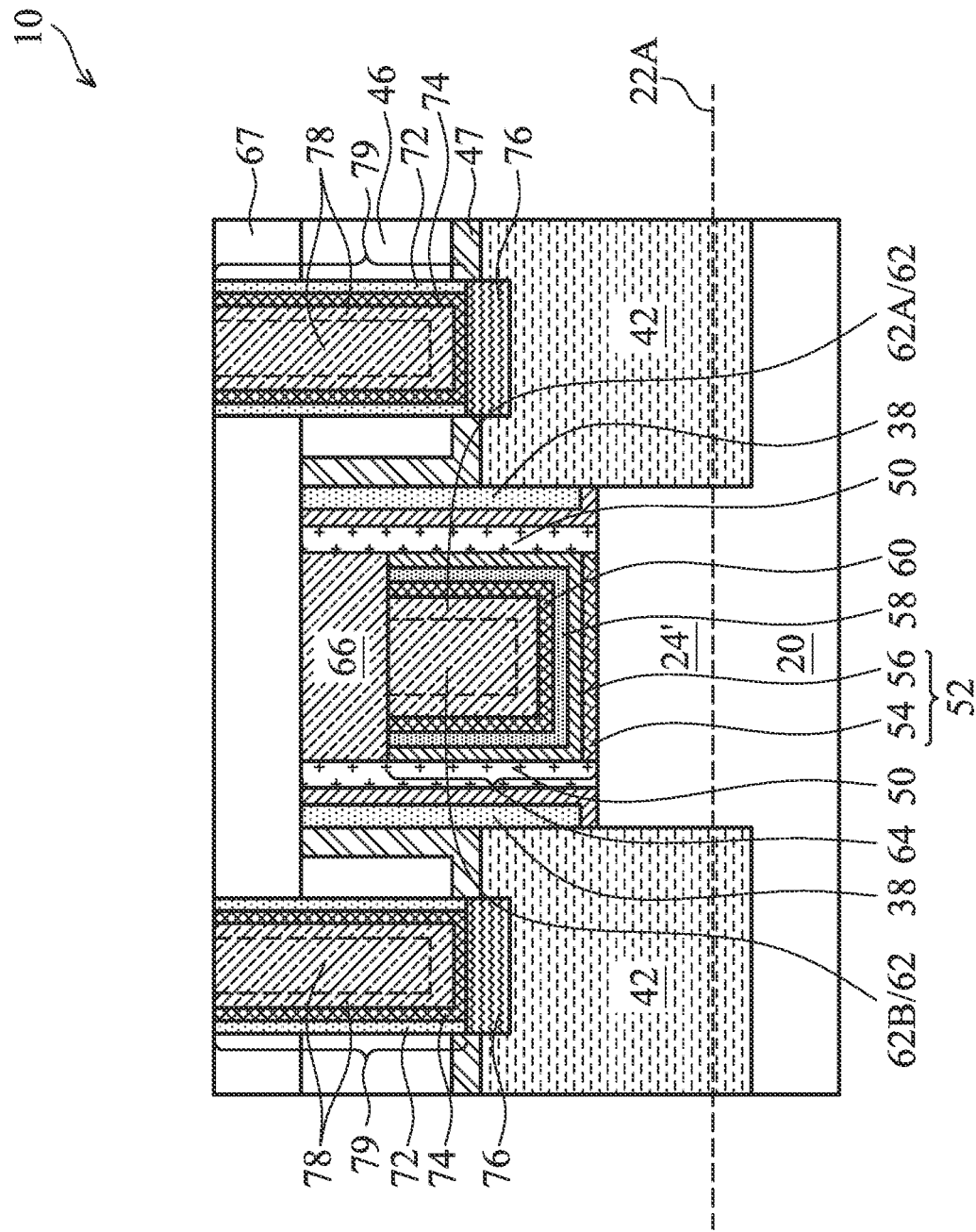

A planarization such as a CMP is then performed to remove the portions of layers 72 and 74 over layer 67. The respective step is illustrated as step 222 in the process flow shown in FIG. 20. The resulting structure is shown in FIG. 14, which illustrate source/drain contact plugs 79. Each of source/drain contact plugs 79 includes metal-containing layer 78, barrier layer 74, and metal layer 72.

Figure 15:
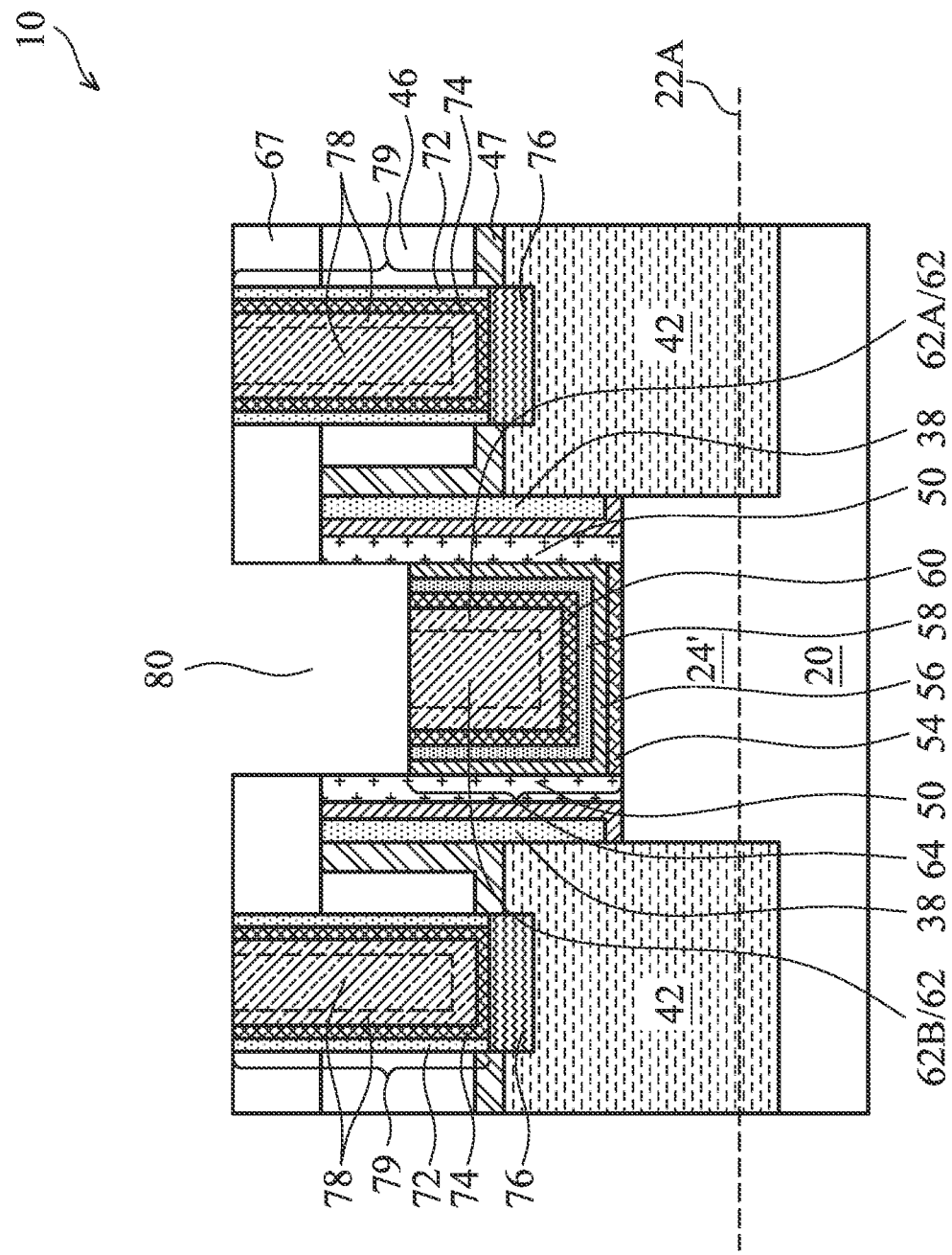
Figure 16:
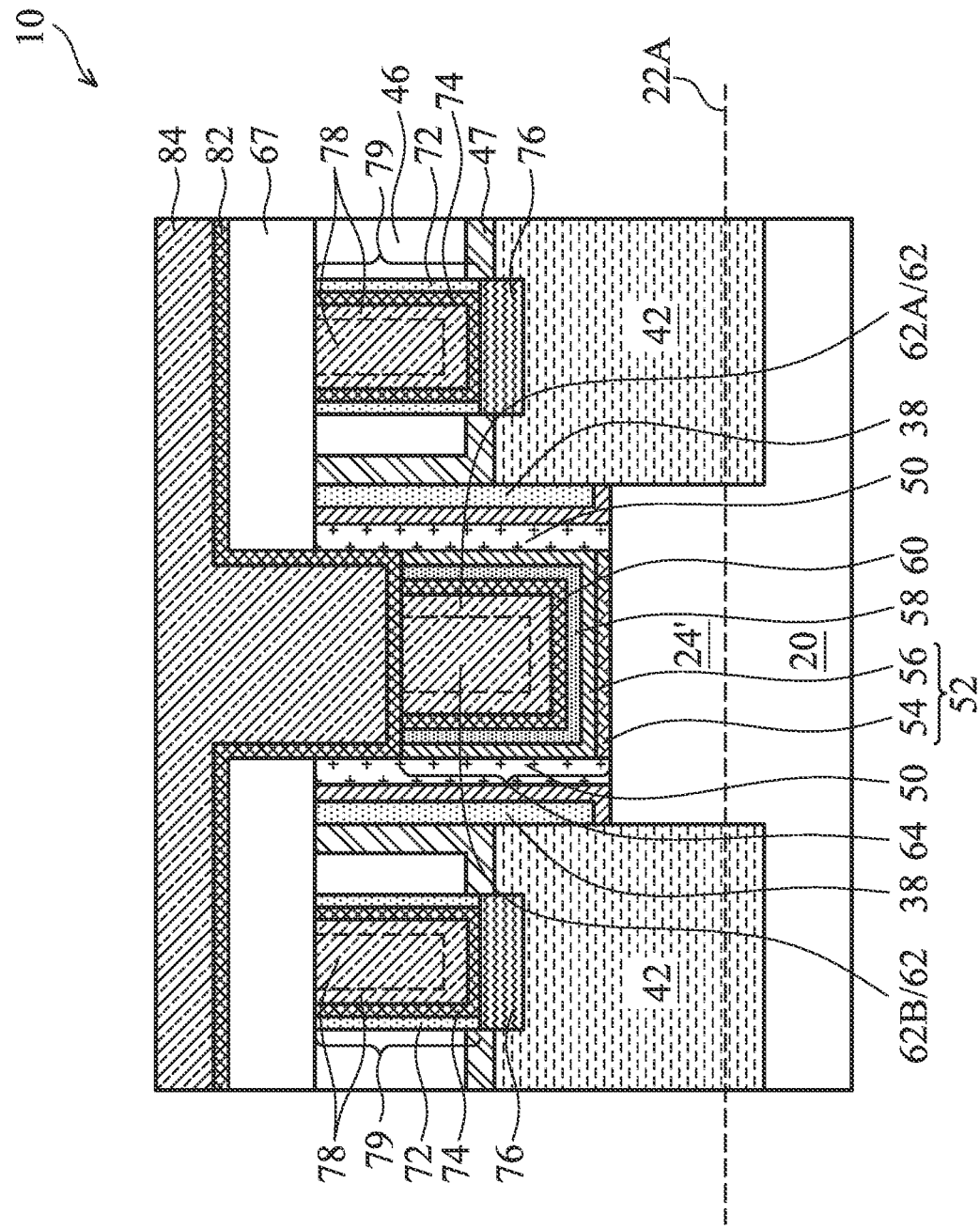
Figure 17:
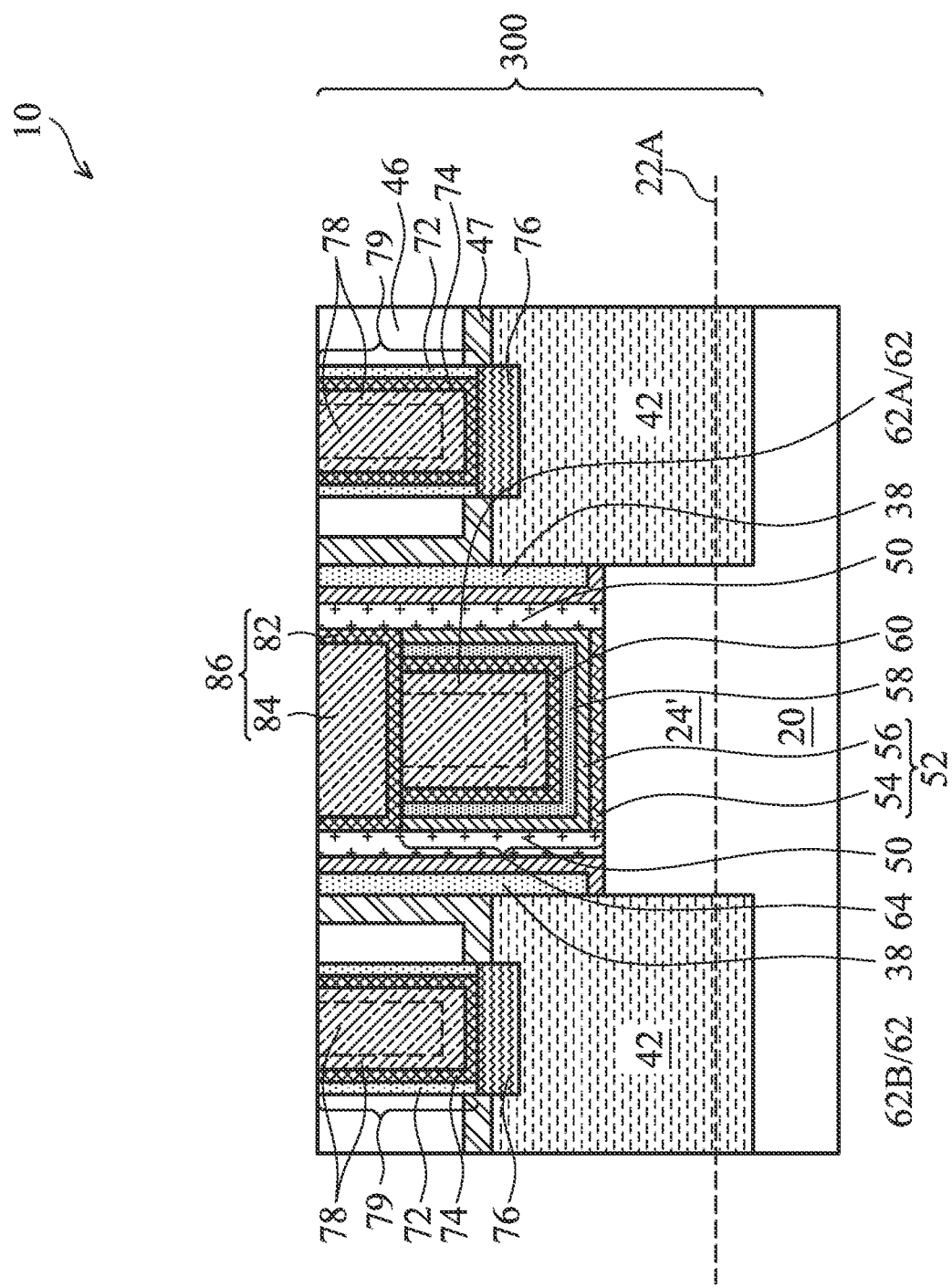

FIGS. 15 through 17 illustrate the formation of a gate contact plug. The respective step is illustrated as step 224 in the process flow shown in FIG. 20. Referring to FIG. 15, a photo lithography process is performed using a lithography mask (not shown) to etch-through dielectric layer 67. Hard mask 66 (FIG. 14) is then removed, forming opening 80. In accordance with some embodiments of the present disclosure, the formation of opening 80 includes an anisotropic etching to etch-through dielectric layer 67, and an isotropic etching (dry or wet) or an anisotropic etch to remove hard mask 66. The sidewalls of gate spacers 50 (if any) are thus exposed. In the embodiments in which gate spacers 50 are not formed, the sidewalls of gate spacers 38 are exposed to opening 80. The etchant for etching dielectric layer 67 and hard mask 66 are selected, so that gate spacers 50 and 38 are substantially not etched. In accordance with alternative embodiments of the present disclosure, opening 80 is narrower than hard mask 66, and hence some edge portions of hard mask 66 are left after the etching.

Referring to FIG. 16, barrier layer 82 and metal-containing material 84 are deposited. Barrier layer 82 may be formed of titanium nitride or tantalum nitride. The material, the structure, and the formation method of metal-containing material 84 may be selected from the candidate materials, the candidate structures, and the candidate formation methods, respectively, of metal-containing material 62, and hence the details are not repeated herein, and may be found referring to the discussion of metal-containing material 62. Accordingly, similar to metal-containing material 62, metal-containing material 84 may also be formed of cobalt, a metal silicide, or composite layers thereof. In a subsequent step, a planarization such as a CMP is performed. The planarization may be performed until all of layer 67 is removed, and ILD 46 is exposed. Accordingly, layer 67 acts as a sacrificial layer. The resulting structure is shown in FIG. 17, which illustrates contact plug 86 formed of the remaining portions of layers 82 and 84. FinFET 300 is thus formed.

Figure 18:
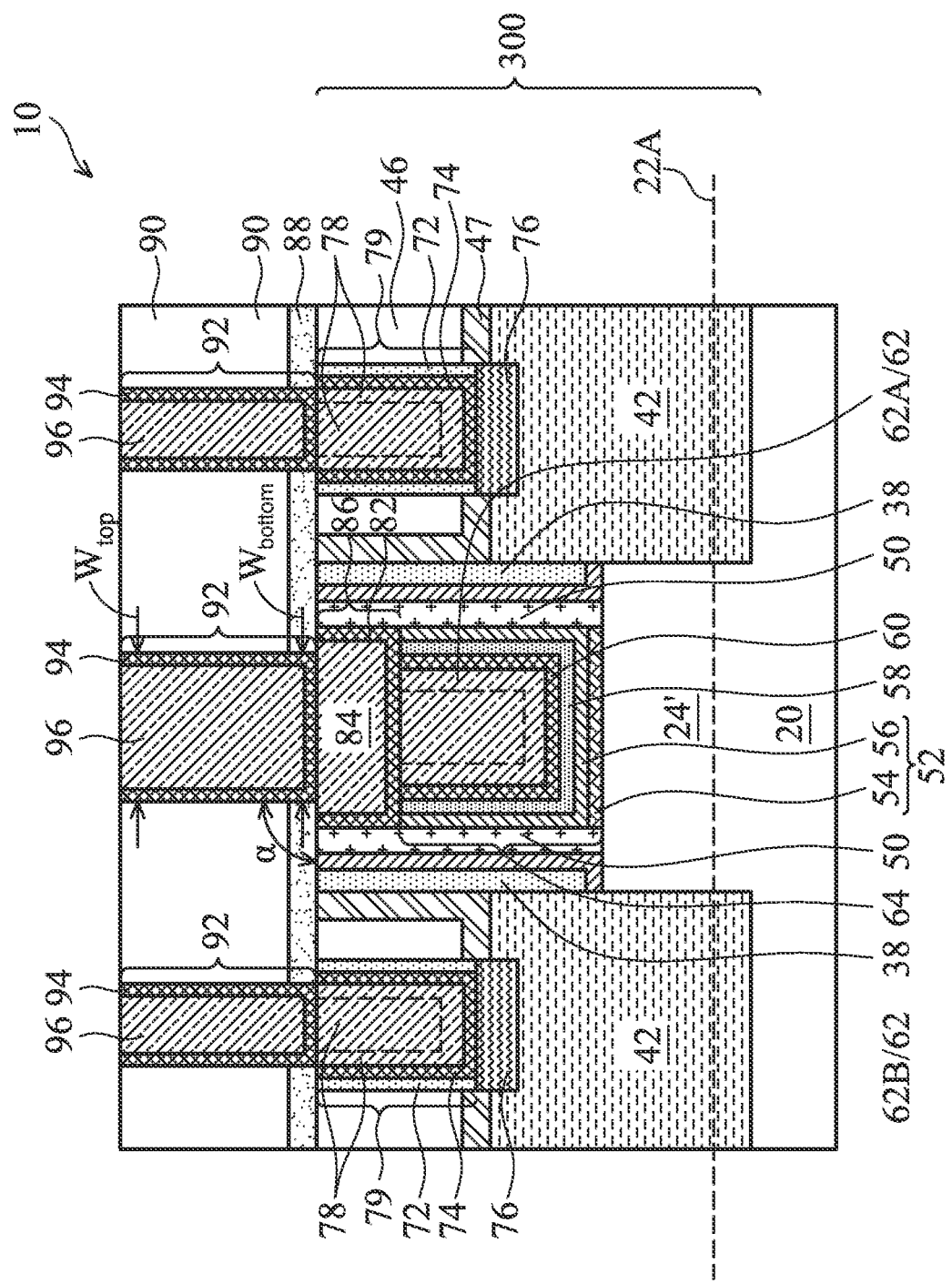

FIG. 18 illustrates the formation of etch stop layer 88, ILD 90, and source/drain contact plugs (vias) 92 in etch stop layer 88 and ILD 90. Etch stop layer 88 may be formed of silicon carbide, silicon oxynitride, silicon carbo-nitride, or the like, and may be formed using a deposition method such as CVD. ILD 90 may include a material selected from PSG, BSG, BPSG, Fuorine-doped Silicon Glass (FSG), TEOS oxide, or other non-porous low-k dielectric materials. ILD 90 may be formed using spin coating, Flowable Chemical Vapor Deposition (FCVD), or the like, or formed using a deposition method such as Plasma Enhanced Chemical Vapor Deposition (PECVD), Low Pressure Chemical Vapor Deposition (LPCVD), or the like.

ILD 90 and etch stop layer 88 are etched to form openings (occupied by vias 92). The etching may be performed using, for example, Reactive Ion Etch (RIE). In a subsequent step, vias 92 are formed. In accordance with some embodiments, vias 92 include barrier layer 94 and metal-containing material 96 over barrier layer 94. In accordance with some embodiments of the present disclosure, the formation of vias 92 include etching layers 88 and 90 to form contact openings, forming a blanket barrier layer and a metal-containing material over the blanket barrier layer, and performing a planarization to remove excess portions of the blanket barrier layer and the metal-containing material. Barrier layer 94 may be formed of a metal nitride such as titanium nitride or tantalum nitride. The material, the structure, and the formation methods of metal-containing material 96 may be selected from the candidate materials, the candidate structures, and the candidate formation methods, respectively, of metal-containing material 62, and hence the details are not repeated herein.

Vias 92 have sidewalls with tilting angle α in the range between about 80 degrees and about 90 degrees. Vias 92 also have top widths $W_{top}$ greater than the respective bottom width $W_{bottom}$. For example, ratio $W_{top}/W_{bottom}$ may be in the range between about 1.2 and about 1.5. Such profile is good for gap filling.

Figure 19:
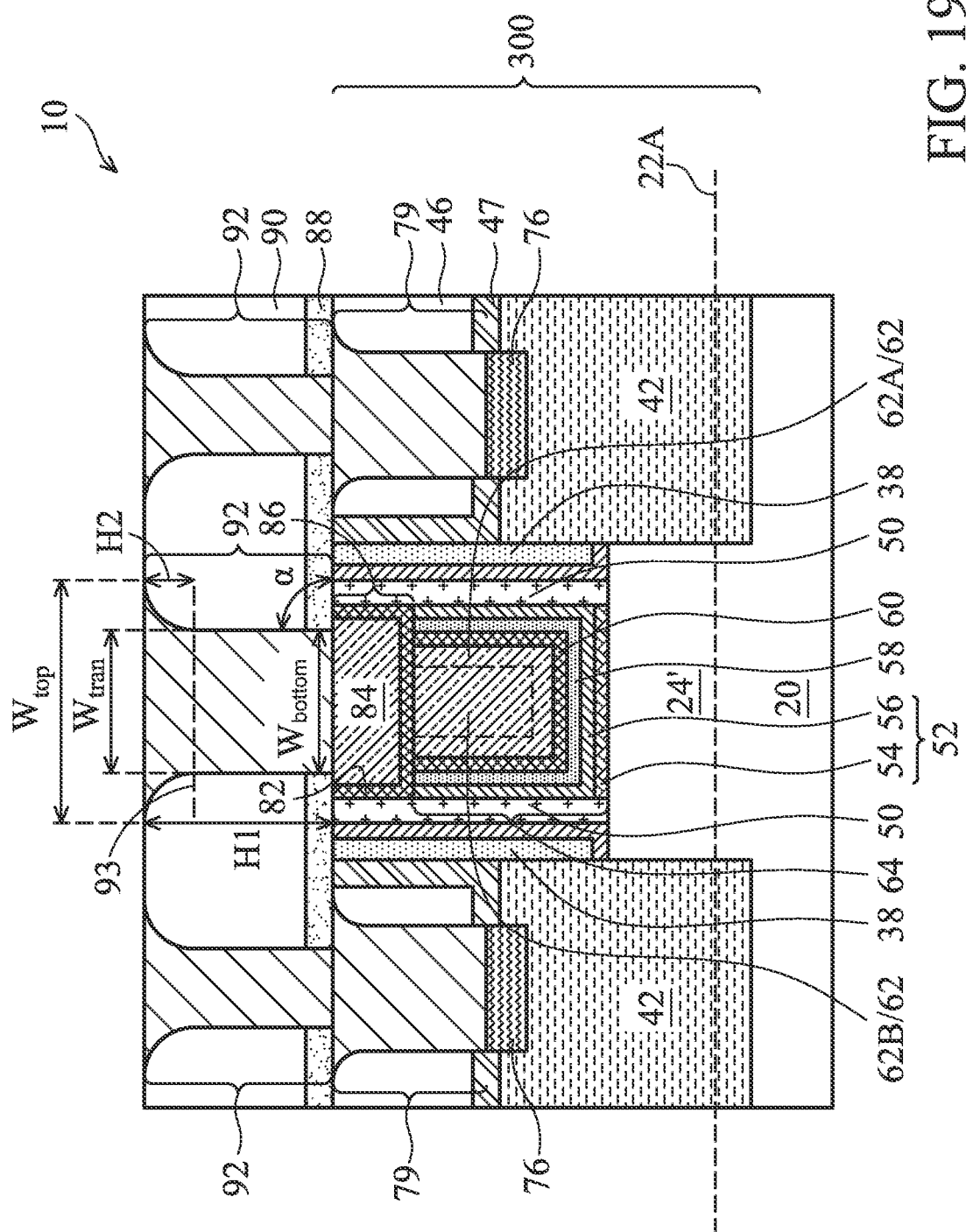
FIG. 19 illustrates a cross-sectional view of a FinFET with actual profile illustrated in accordance with some embodiments.

FIG. 19 illustrates a cross-sectional view of a FinFET in accordance with some embodiments. In accordance with some embodiments of the present disclosure, as shown in FIG. 19, the sidewalls of contact plugs 92 have substantially straight and slanted lower portions, and curved upper portions, and line 93 is drawn to show the transitioning level between the upper portion and the lower portion. The upper portions of the sidewalls may have substantial abrupt change of slope comparing to the respective lower portions. The height of contact plug 92 is marked as H1. The height of the top portion of contact plug 92 is marked as H2. The top width and the bottom width are marked as $W_{top}$ and $W_{bottom}$, respectively. Width $W_{bottom}$ is measured at 95% of the depth H1 of contact plug 92. The width of contact plug 92 at the transition point is $W_{tran}$. In accordance with some embodiments of the present disclosure, ratio $W_{tran}/W_{bottom}$ may be between about 1.2 and about 1.5. The ration H2/H1 may be between about 0.1 and about 0.2. Slant angle α may be between about 80 degrees and about 90 degrees, and may be around 85 degrees. Although the dimensions and slant angles of contact plugs 79 are not illustrated in detail, contact plugs 79 may have similar profiles.

The embodiments of the present disclosure have some advantageous features. When etching dielectric layers, polymers may be generated. In order to remove the residue polymer formed due to the etching of dielectric layers, an acidic solution (such as $H_2O_2$), may be used. Cobalt has good resistance to acid. The acidic solution causes the corrosion of the exposed metal. If tungsten is used, it is more likely to be corroded. Cobalt, on the other hand, is more resistant to the corrosion, and the problem generated by the corrosion of the metal such as metal gate loss, may be reduced. Cobalt also has a smaller roughness than tungsten, making it a better material for forming high-quality films.

In addition, cobalt and metal silicides have low resistivity values than tungsten at very small dimensions due to scattering effect. Also, tungsten doesn't have good adhesion to some barrier materials such as TiN. Accordingly, conventionally, a nucleation tungsten layer was formed, followed by the deposition of tungsten using CVD. The tungsten nucleation layer has a resistivity in the range between about 200 μOhm*cm and about 250 μOhm*cm, which is much higher than the resistivity (about 5.7 μOhm*cm) of CVD tungsten. Accordingly, the resistivity of the nucleation tungsten layer significantly degrades the performance of the resulting transistor. Cobalt (or metal silicide), on the other hand, has a very low resistivity (about 5.8 μOhm*cm for cobalt silicide), and has good adhesion to TiN. Accordingly, by adopting cobalt and/or metal silicide, the adhesion to the underlying barrier layer is good, and the resistivity of the metal gate is low.

In accordance with some embodiments of the present disclosure, a method includes forming a transistor, which includes forming a gate dielectric on a semiconductor region, forming a gate electrode over the gate dielectric, and forming a source/drain region extending into the semiconductor region. The method further includes forming a source/drain contact plug over and electrically coupling to the source/drain region, and forming a gate contact plug over and in contact with the gate electrode. At least one of the forming the gate electrode, the forming the source/drain contact plug, and the forming the gate contact plug includes forming a metal nitride barrier layer, and depositing a metal-containing layer over and in contact with the metal nitride barrier layer. The metal-containing layer includes at least one of a cobalt layer and a metal silicide layer.

In accordance with some embodiments of the present disclosure, a method includes forming a transistor, which includes forming a dummy gate stack over a semiconductor region, forming an ILD with the dummy gate stack being in the ILD, removing the dummy gate stack to form an opening in the ILD, forming a replacement gate dielectric extending into the opening, forming a work-function metal layer over the replacement gate dielectric, forming a barrier layer including titanium nitride over the replacement gate dielectric, and depositing a cobalt-containing layer extending into the opening. The cobalt-containing layer overlies, and is in contact with, the barrier layer. A planarization is performed to remove excess portions of the replacement gate dielectric, the work-function metal layer, the barrier layer, and the cobalt-containing layer to from a replacement gate stack. A source region and a drain region are formed on opposite sides of the replacement gate stack.

In accordance with some embodiments of the present disclosure, a device includes gate spacers, a gate dielectric, and a gate electrode. The gate electrode includes a first metal nitride layer over the gate dielectric, and a work-function metal layer over the first metal nitride layer. The gate dielectric and the gate electrode extend between the gate spacers. A gate contact plug is over and contacting the gate electrode. A source/drain region is adjacent to the gate electrode. A source/drain contact plug is over and electrically coupling to the source/drain region. At least one of the gate electrode, the source/drain contact plug, and the gate contact plug includes a second metal nitride layer, and a metal-containing layer over and contacting the second metal nitride layer. The metal-containing layer includes at least one of a cobalt layer and a metal silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   gate spacers;
   a gate dielectric extending into a space between the gate spacers;
   a gate electrode comprising:
      a first metal nitride layer over the gate dielectric, wherein the first metal nitride layer comprises a titanium nitride layer; and
      a work-function metal layer over the first metal nitride layer, wherein the first metal nitride layer and the work-function metal layer are located between the gate spacers, and wherein the work-function metal layer comprises titanium and aluminum;
   a source/drain region adjacent to the gate electrode;
   a source/drain silicide layer over and contacting the source/drain region; and
   a source/drain contact plug over and contacting the source/drain silicide layer, wherein the source/drain contact plug comprises:
      a second metal nitride layer; and
      a cobalt-containing layer over and contacting the second metal nitride layer.

2. The device of claim 1, wherein the source/drain silicide layer comprises titanium silicide, and the second metal nitride layer comprises titanium nitride.

3. The device of claim 1, wherein the cobalt-containing layer comprises elemental cobalt.

4. The device of claim 2 further comprising a tantalum nitride layer between the titanium nitride layer and the work-function metal layer.

5. The device of claim 1, wherein the first metal nitride layer comprises a tantalum nitride layer, and the work-function metal layer comprises a titanium nitride layer.

6. The device of claim 1, wherein the gate spacers comprise silicon and oxygen.

7. The device of claim 1, wherein the second metal nitride layer contacts opposing sidewalls of the cobalt-containing layer.

8. The device of claim 1, wherein the source/drain region comprises silicon germanium, and the source/drain silicide layer comprises titanium germane silicide.

9. The device of claim 1, wherein the source/drain contact plug comprises a sidewall comprising:
   a straight lower portion; and
   a curved upper portion over the straight lower portion, wherein the curved upper portion is less vertical than the straight lower portion.

10. A device comprising:
    a semiconductor fin;
    a gate stack on the semiconductor fin;
    a gate contact plug over and contacting the gate stack, wherein the gate contact plug comprises a first top surface;
    a source/drain region aside of the gate stack;
    a source/drain contact plug over and electrically connecting to the source/drain region, wherein the source/drain contact plug comprises a second top surface substantially coplanar with the first top surface, and wherein the source/drain contact plug comprises:
       a metal nitride layer comprising a bottom portion, and sidewall portions connecting to opposing ends of the bottom portion, wherein the metal nitride layer comprises TiN; and
       a cobalt layer over and contacting the bottom portion of the metal nitride layer, wherein the sidewall portions of the metal nitride layer contact the cobalt layer, wherein the cobalt layer comprises elemental cobalt; and
    a TiSi layer over the source/drain region.

11. The device of claim 10 further comprising a dielectric layer, wherein the second top surface contacts a bottom surface of the dielectric layer to form a horizontal interface, and wherein the first top surface is coplanar with the bottom surface of the dielectric layer.

12. The device of claim 10 further comprising:
    a source/drain silicide layer over and contacting the source/drain region, wherein the source/drain silicide layer comprises a first portion lower than a third top surface of the source/drain region, and a second portion higher than the third top surface.

13. The device of claim 10, wherein the metal nitride layer comprises titanium nitride, and the titanium nitride is in physical contact with the cobalt layer.

14. The device of claim 10, wherein the gate stack comprises:
    a first titanium nitride layer;
    an aluminum-containing layer over the first titanium nitride layer; and
    a second titanium nitride layer over the aluminum-containing layer.

15. The device of claim 10 further comprising a TiSiGe layer over the source/drain region, wherein the metal nitride layer comprises TiN, and the cobalt layer comprises elemental cobalt.

16. The device of claim 11, wherein the gate stack comprises:
    a hafnium oxide layer;
    a first TiN layer over the hafnium oxide layer;
    a TaN layer over the first TiN layer; and
    a titanium-and-aluminum containing layer over the TaN layer; and a second TiN layer over the titanium-and-aluminum containing layer.

17. The device of claim 10, wherein the source/drain contact plug comprises a sidewall comprising:
- a straight lower portion; and
- a curved upper portion over the straight lower portion, wherein the curved upper portion is less vertical than the straight lower portion.

18. A device comprising:
- a semiconductor region;
- a gate stack on the semiconductor region, the gate stack comprising:
  - a gate dielectric; and
  - a gate electrode on the gate dielectric, the gate electrode comprising:
    - a first titanium nitride layer over the gate dielectric;
    - an aluminum-containing layer over the first titanium nitride layer; and
    - a second titanium nitride layer over the aluminum-containing layer;
- a source/drain region aside of the gate stack;
- a source/drain silicide layer on the source/drain region; and
- a source/drain contact plug comprising:
  - a titanium nitride liner over and contacting the source/drain silicide layer; and
  - a cobalt-containing layer in the titanium nitride liner.

19. The device of claim 18, wherein the cobalt-containing layer comprises elemental cobalt.

20. The device of claim 18 further comprising a gate contact plug over and connecting to the gate electrode, wherein top surfaces of the gate contact plug and the source/drain contact plug are coplanar.

* * * * *